(12) United States Patent
Silva et al.

(10) Patent No.: US 10,385,449 B2
(45) Date of Patent: Aug. 20, 2019

(54) METHOD FOR GRAPHENE AND CARBON NANOTUBE GROWTH

(71) Applicant: UNIVERSITY OF SURREY, Surrey (GB)

(72) Inventors: Sembukuttiarachilage Ravi Silva, Surrey (GB); Muhammad Ahmad, Surrey (GB)

(73) Assignee: UNIVERSITY OF SURREY, Surrey (GB)

( * ) Notice: Subject to any disclaimer, the term of this patent is extended or adjusted under 35 U.S.C. 154(b) by 112 days.

(21) Appl. No.: 15/317,562

(22) PCT Filed: Jun. 5, 2015

(86) PCT No.: PCT/GB2015/051634
§ 371 (c)(1),
(2) Date: Dec. 9, 2016

(87) PCT Pub. No.: WO2015/189575
PCT Pub. Date: Dec. 17, 2015

(65) Prior Publication Data
US 2017/0121177 A1 May 4, 2017

(30) Foreign Application Priority Data

Jun. 9, 2014 (GB) .................................. 1410214.9

(51) Int. Cl.
*G11B 5/64* (2006.01)
*C23C 16/455* (2006.01)
*C01B 32/16* (2017.01)
*C01B 32/186* (2017.01)

(52) U.S. Cl.
CPC ............ *C23C 16/455* (2013.01); *C01B 32/16* (2017.08); *C01B 32/186* (2017.08)

(58) Field of Classification Search
None
See application file for complete search history.

(56) References Cited

U.S. PATENT DOCUMENTS

| 2009/0011241 A1* | 1/2009 | Zhu ........................ B82Y 30/00 428/402 |
| 2011/0030991 A1 | 2/2011 | Veerasamy |
| 2011/0198313 A1 | 8/2011 | Baraton et al. |
| 2012/0202813 A1 | 8/2012 | Chimmanamada et al. |
| 2013/0001515 A1 | 1/2013 | Li et al. |
| 2013/0323494 A1 | 12/2013 | Ueno et al. |
| 2014/0015158 A1 | 1/2014 | Cola |
| 2014/0120270 A1* | 5/2014 | Tour ........................ C23C 16/26 427/596 |

FOREIGN PATENT DOCUMENTS

| WO | WO-2012148439 A1 * | 11/2012 | ............. C23C 16/26 |
| WO | 2013076164 A1 | 5/2013 | |

OTHER PUBLICATIONS

Tour, et al. "Direct Growth of Bilayer Graphene on SiO2 Substrates by Carbon Diffusion through Nickel", ACS Nano, 5(10), 8241-8247, Sep. 3, 2011. (Year: 2011).*
Z Peng, "Direct growth of bilayer graphene on SiO2 substrates by carbon diffusion through nickel" [online], pub. 2011, ACS. Available from http://www.thermalcond.eu/detalle_articulo.php?ar_id=349 [Accessed Dec. 3, 2014].
W-J Kim, "Transfer-free synthesis of multilayer graphene using a single-step process in an evaporator and formation confirmation by laser mode-locking" [online], pub 2013, IOP. Available from http://iopscience.iop.org/0957-4484/24/36/365603/pdf/0957-4484_24_36_365603.pdf [Accessed Dec. 3, 2014].
Search Report and Examination Opinion dated Dec. 8, 2014 in Application No. GB1410214.9, 6 pages.
International Search Report and Written Opinion dated Dec. 3, 2015, in International Application No. PCT/GB2015/051634, 15 pages.

* cited by examiner

*Primary Examiner* — Christopher M Rodd
(74) *Attorney, Agent, or Firm* — Kilpatrick Townsend & Stockton LLP

(57) ABSTRACT

A layer stack for growing graphene or carbon nanotubes (CNTs) is described. The layer stack comprises a substrate, a protective layer, and an attachment surface disposed therebetween. The protective layer is configured to allow carbon diffusion therethrough to the attachment surface, such that graphene or CNTs grow therefrom.

19 Claims, 19 Drawing Sheets

Schematic of CNT-Graphene interconnects

Protected catalyst scheme

METHOD FOR GRAPHENE AND CARBON NANOTUBE GROWTH

This application claims the benefit of International Application No. PCT/GB2015/051634, filed Jun. 5, 2015, which claims the benefit of United Kingdom Application No. 1410214.9, filed Jun. 9, 2014, all of which are incorporated by reference in their entirety, into this application, and from which priority is claimed.

The present invention relates to graphene and carbon nanotube growth, and particularly to a novel protected catalyst method for graphene and carbon nanotube growth. The invention relates to layer stacks that enable the method to be performed, and to uses of the stacks. In particular the method allows for the growth of nanocarbon materials on substrate materials such as metal sheets, steels, to plastics, to glass, semiconductors such as silicon, GaAs and other 2D layered materials.

A single layer graphene is a two dimensional (2D) material which is one-atom thick (~0.34 nm), composed of carbon atoms where the atoms are arranged in a hexagonal structure. Graphene also exists as few layer graphene sheets and multilayer graphene sheets. Rolled-up sheets of graphene form a cylindrical structure form 1D carbon nanotubes (CNT's), which can be single wall carbon nanotubes (SWCNT's) or multiwall carbon nanotubes (MWCNT's).

The electronic configuration of a carbon atom is $1s^2\ 2s^2\ 2p^2$, where four valence electrons occupy the $2s^2$ and $2p^2$ orbitals. Due to the small energy difference between $2s^2$ and $2p^2$ orbitals, their electronic wave functions overlap to result in $sp^2$ hybridization in carbon. Graphene is the strongest known single layer material, being stronger than diamond and about 300 times harder than steel because of the strong in-plane $sp^2$ bonding. Graphene is also an ideal two dimensional ballistic conductor of very high electrical conductivity. Highest thermal conductivity of 5000 $Wm^{-1}K^{-1}$ has also been reported for graphene. All these attributes make graphene suitable for a number of applications [1].

In addition to the above factors, graphene can also be functionalised by adding chemical moieties which allow for the material to be produced in a suspended solvable form. These materials can then be used in composites and can form gas, electrical, chemical and optical sensors.

Graphene is also a corrosion resistant nano-sheet. Owing to its superior electrical and mechanical properties, graphene is highly attractive for metal overcoats in order to increase their life. Furthermore, it can be used in a variety of other applications such as electronics, aerospace, automobiles, paints and coatings, fuel cells, thermal sinks, solar cells, transparent corrosion free electrodes, etc. [2]. Carbon nanotubes (CNTs) exhibit most of the properties inherited from graphene, share many of the applications for which graphene could be employed as well as applications unique to them. For instance, graphene being in the form of sheets and ribbons may act as a corrosion-resistant barrier layer for metals and lateral interconnects for electrical conduction, whereas CNTs being cylindrical are suitable for complementary metal-oxide-semiconductor (CMOS) integrated circuit applications such as vertical interconnect access (via) and TSVs (through silicon vias).

A key difficulty of using graphene/CNTs in many applications is their poor adhesion to the substrate which can give rise to reliability issues and also compromise good electrical contacts. In chemical vapour deposition (CVD) of both graphene and CNTs, a metal catalyst is used which is susceptible to environmental poisoning, such as oxidation, prior to the growth process and hence degrades the material properties. The poisoned catalyst may further poison underneath materials. Furthermore, many in-situ graphene/CNT based device fabrication processes involve patterning where etching is performed. In a buried catalyst arrangement (where the catalyst is underneath the dielectric layer), the catalyst is also attacked by etchants during the etching process. Protection of the catalyst film from etchants attack, environmental/process poisoning and growth of reliably attached material with the substrate is highly favourable for the applications of graphene/CNTs in various areas.

The present invention arises from applicant's work in addressing these recognised problems.

According to a first aspect of the invention, there is provided a layer stack for growing graphene or carbon nanotubes (CNTs), wherein the layer stack comprises a substrate, a protective layer, and an attachment surface disposed therebetween, wherein the protective layer is configured to allow carbon diffusion therethrough to the attachment surface, such that graphene or CNTs grow therefrom.

Preferably, the attachment surface for the graphene or CNTs is disposed adjacent the protective layer. The substrate may itself be capable of catalysing the growth of the graphene and/or CNTs from the attachment surface. Preferably, where the substrate is capable of catalysing the growth of graphene and/or CNTs the substrate comprises nickel (Ni), copper (Cu), iron (Fe) or steel. However, preferably the layer stack comprises a catalyst layer disposed between the substrate and the protective layer, wherein the catalyst layer is capable of catalysing the growth of the graphene and/or the CNTs from the attachment surface.

Hence, in a preferred embodiment, the layer stack comprises a substrate, a catalyst layer disposed adjacent the substrate, and a protective layer disposed adjacent the catalyst layer. In this embodiment, the attachment surface for the graphene or CNT growth is preferably disposed between the protective layer and the catalyst layer.

Preferably, the catalyst layer comprises a material selected from a group consisting of: to Copper (Cu), Nickel (Ni), Ruthenium (Ru), Cobalt (Co), Iron (Fe), Rubidium (Rd), Platinum (Pt), Iridium (Ir), Palladium (Pd), Rhodium (Rh), carbides, Silver (Ag), Gold (Au), steel or a composite of any two or more of the aforementioned materials. A preferred catalyst layer comprises Fe. The catalyst layer may be between 1 nm and 500 nm in cross-section. Preferably, where the layer stack is intended for growing graphene, the catalyst layer is between 200 nm and 500 nm in cross-section. Alternatively, where the layer stack is intended for growing CNTs, the catalyst layer is preferably between 3 nm and 9 nm in cross-section.

Preferably, the layer stack comprises a support layer disposed between the catalyst layer and the substrate. Advantageously, the support layer is provided to prevent catalyst diffusion and increase catalytic activity. It can also act to increase energy reflection to the catalyst. Preferably, the support layer comprises a material selected from a group consisting of: Silicon Dioxide ($SiO_2$), Aluminium Oxide ($Al_2O_3$), Copper (Cu), Aluminium (Al), Tungsten (W), Palladium (Pd), Gold (Au), Silver (Ag), Titanium (Ti), Tantalum (Ta), Tantalum Nitride (TaN) and Titanium Nitride (TiN). The support layer may comprise at least two layers wherein each layer comprises a different composition. For example, the support layer may comprise combinations selected from a group consisting of: TiN/Al, Ti/TiN, Ta/TaN, Ta/TiN, TiN/Ta or Ti/Cu/TiN/Al etc. The support layer may be between 2 nm and 400 nm in cross-section.

Hence, in a preferred embodiment, the layer stack comprises a substrate, a support layer disposed adjacent the substrate, a catalyst layer disposed adjacent the support layer, and a protective layer disposed adjacent the catalyst layer. In this embodiment, the attachment surface for the graphene or CNT growth is preferably disposed between the protective layer and the catalyst layer.

Advantageously, the protective layer protects the substrate and/or catalyst layer from poisoning. Examples of poisoning which the protective layer protects the substrate and/or catalyst layer from include environmental and/or process poisoning such as oxidation and incorporation of unwanted gaseous/solid impurities. The protective layer can also be configured to protect catalyst from etchants attack during patterning of a sample. Etchants may for example include gases such as Tetrafluoromethane ($CF_4$), Sulfur hexafluoride ($SF_6$), Oxygen ($O_2$), Ammonia ($NH_3$), Fluoroform ($CHF_3$), Chlorine ($Cl_2$), Chloroform ($CHCl_3$), Hydrogen Fluoride (HF) etc. or wet chemicals such as Hydrochloric Acid (HCl), Nitric Acid ($HNO_3$), Hydrogen Peroxide ($H_2O_2$), Ammonium Hydroxide ($NH_4OH$), Hydrofluoric acid ($HF_{(aq)}$), Buffered Hydrofluoric Acid (BHF), Potassium Hydroxide (KOH), Sodium Hydroxide (NaOH), Acetic Acid ($CH_3COOH$), Phosphoric Acid ($H_3PO_4$), etc.

In addition, advantageously the provision of the protective layer helps to limit or control the number of graphene layers that grow from the attachment surface. Preferably, the graphene, which grows, is either single-layer-graphene (SLG) or few-layer graphene (FLG). Also, the inventors were surprised to observe that the protective layer provides significantly improved adhesion of the graphene or CNTs to the attachment surface compared to embodiments where the protective layer is absent.

Preferably, the protective layer comprises a material selected from a group consisting of: Titanium Nitride (TiN), Titanium (Ti), polyimide, plastics, polytetrafluoroethylene (PTFE), PDMS (Polydimethylsiloxane), Tantalum (Ta), Tantalum Nitride (TaN), Gold (Au), Silver (Ag), Palladium (Pd), Chromium (Cr) and polymers, such as parylene (poly (p-xylylene)) polystyrene, polyacrylate, polyethylene, Polyethylene terephthalate (PET) etc. The protective layer may also be selected from 2D layered materials such as Boron Nitride (BN), Molybdenum disulfide ($MoS_2$), Molybdenum selenide (MoSe), Tungsten sulphide ($WS_2$), etc. Preferably, however, the protective layer comprises Titanium Nitride (TiN).

The protective layer may be between 1 nm and 500 nm in cross-section. Preferably, the protective layer is between 1 nm and 100 nm in cross-section. More preferably, the protective layer is between 3.5 nm and 17 nm in cross-section.

The substrate may comprise a material selected from a group consisting of: Silicon (Si), Aluminium Oxide ($Al_2O_3$), Silicon Carbide (SiC), steel, Cu, Ni, plastics, polymers, glass, Gallium Arsenide (GaAs), Al and zeolite. Alternatively, the substrate may comprise a material coated with a 2D layered materials such as Boron Nitride (BN), Molybdenum Disulfide ($MoS_2$), Molybdenum Selenide (MoSe), Tungsten sulphide ($WS_2$), etc. Preferably, the substrate is at least 10 micrometers thick in cross-section, and more preferably is between 10 micrometers and 100 mm in cross-section, or more. For example, for semiconductor applications, the substrate may be about 10 μm to 2 mm, and for larger applications, the substrate may be greater than 50 mm in cross-section.

The layer stack may comprise the structure Sub:[Cat:Pro]$_n$, wherein Sub corresponds to a substrate, Cat corresponds to the catalyst layer and Pro corresponds to the protective layer, and n is greater than 1. In some embodiments, n may be 2, 3, 4 or 5, or more. In other embodiments, n may be at least 10, 50, 100, 150, 200 or more. Preferably, the catalyst and protective layers are alternately disposed onto the substrate. For example, the layer stack may comprise: (i) a substrate, (ii) a catalyst layer, (iii) a protective layer, (iv) a catalyst layer, and (v) a protective layer, which would be represented by Sub:[Cat:Pro]$_2$, or (i) a substrate, (ii) a catalyst layer, (iii) a protective layer, (iv) a catalyst layer, (v) a protective layer, (vi) a catalyst layer, and (vii) a protective layer, which would be represented by Sub: [Cat:Pro]$_3$, and so on, depending on the required number of layers.

Alternatively, the layer stack may comprise the structure Sub:[Sup:Cat:Pro]$_n$, wherein Sub corresponds to a substrate, Sup corresponds to a support layer, Cat corresponds to the catalyst layer and Pro corresponds to the protective layer, and n is greater than 1. In some embodiments, n may be 2, 3, 4 or 5, or more. In other embodiments, n may be at least 10, 50, 100, 150, 200 or more. For example, the layer stack may comprise: (i) a substrate, (ii) a support layer, (iii) a catalyst layer, (iv) a protective layer, (v) a support layer, (vi) a catalyst layer, and (vii) a protective layer, which would be represented by Sub:[Sup:Cat:Pro]$_2$, or (i) a substrate, (ii) a support layer, (iii) a catalyst layer, (iv) a protective layer, (v) a support layer, (vi) a catalyst layer, (vii) a protective layer, (viii) a support layer, (ix) a catalyst layer, and (x) a protective layer, which would be represented by Sub:[Sup:Cat:Pro]$_3$, and so on, depending on the required number of layers. In this way, it is possible to grow multiple layers of graphene or CNTs in a single layer stack.

In a second aspect, there is provided a method for manufacturing a layer stack for use in growing graphene or carbon nanotubes (CNTs), the method comprising:—
  a) providing a substrate, and
  b) depositing a protective layer on the substrate, such that an attachment surface is disposed between the substrate and the protective layer, thereby creating a layer stack, wherein the protective layer is configured to allow carbon diffusion therethrough to the attachment surface, such that graphene or CNTs grow therefrom.

Preferably, the layer stack that is manufactured is as defined with respect to the first aspect.

The substrate provided in step (a) may comprise a material selected from a group consisting of: Silicon (Si), Al, Aluminium Oxide ($Al_2O_3$), Silicon Carbide (SiC), steel, Ni, Cu, Fe plastics, polymers, glass, Gallium Arsenide (GaAs) and zeolite. Or the substrate may comprise a material coated with a 2D layered materials such as Boron Nitride (BN), Molybdenum Disulfide ($MoS_2$), Molybdenum Selenide (MoSe), Tungsten sulphide ($WS_2$), etc. Preferably, the substrate is at least 10 micrometers thick in cross-section, and more preferably is between 10 micrometers and 100 mm in cross-section, or more. For example, for semiconductor applications, the substrate may be about 10 μm to 2 mm, and for larger applications, the substrate may be greater than 50 mm in cross-section.

Preferably, the protective layer comprises a material selected from a group consisting of: Titanium Nitride (TiN), Titanium (Ti), polyimide, plastics, polytetrafluoroethylene (PTFE), PDMS (Polydimethylsiloxane), Tantalum (Ta), Tantalum Nitride (TaN), Gold (Au), Silver (Ag), Palladium (Pd), Chromium (Cr) and polymers, such as parylene (poly (p-xylylene)) polystyrene, polyacrylate, polyethylene, Polyethylene terephthalate (PET) etc. The protective layer may also be selected from 2D layered materials such as BN, $MoS_2$, MoSe, $WS_2$, etc. Preferably, however, the protective layer comprises Titanium Nitride (TiN).

As such, the protective layer may be between 1 nm and 500 nm in cross-section. Preferably, the protective layer is between 1 nm and 100 nm in cross-section. More preferably, the protective layer is between 3.5 nm and 17 nm in cross-section.

The method preferably comprises depositing a catalyst layer on the substrate, preferably before the protective layer has been deposited. Preferably, the catalyst layer comprises a material selected from a group consisting of: Copper (Cu), Nickel (Ni), Ruthenium (Ru), Cobalt (Co), Iron (Fe), Rubidium (Rd), Platinum (Pt), Iridium (Ir), Palladium (Pd), Rhodium (Rh), carbides, Silver (Ag), Gold (Au), steel or a composite of any two or more of the aforementioned materials. A preferred catalyst layer comprises Fe. The catalyst layer may be between 1 nm and 500 nm in cross-section. Preferably, where the layer stack is intended for growing graphene, the catalyst layer is between 200 nm and 500 nm in cross-section. Alternatively, where the layer stack is intended for growing CNTs the catalyst layer is preferably between 3 nm and 9 nm in cross-section.

Preferably, the method comprises depositing a support layer on the substrate, preferably before the catalyst layer has been deposited. Preferably, the support layer comprises a material selected from a group consisting of: Silicon Dioxide ($SiO_2$), Aluminium Oxide ($Al_2O_3$), Copper (Cu), Aluminium (Al), Tungsten (W), Palladium (Pd), Gold (Au), Silver (Ag), Titanium (Ti), Tantalum (Ta), Tantalum Nitride (TaN) and Titanium Nitride (TiN) The support layer may comprise at least two layers wherein each layer comprises a different composition. For example, the support layer may comprise combinations selected from a group consisting of: TiN/Al, Ti/TiN, Ta/TaN, Ta/TiN, TiN/Ta, Ti/Cu/TiN/Al or Ti/Cu/TiN/Al etc. The support layer may be between 2 nm and 400 nm in cross-section.

In an alternative embodiment, in which a catalyst layer is not provided, the substrate may be capable of catalysing the growth of graphene and/or CNTs and the substrate preferably comprises nickel (Ni), copper (Cu), iron (Fe), steel.

Preferably, the support layer, catalyst layer and/or protective layer are sputter deposited. The layers could be cluster source deposited, electron beam evaporated, thermally evaporated, solution deposited, solution evaporated, ion implanted, spin coated, chemical vapour deposited, plasma chemical vapour deposited, plasma immersion deposited or electrodeposited. Sputter depositing will be well-known to the skilled person, and is described in the Examples. The different layers are preferably deposited sequentially onto the substrate in an inert environment without breaking vacuum. Thus, advantageously exposure of the catalyst layer to the atmosphere is avoided.

In embodiments where the method comprises depositing a catalyst layer on the substrate the steps of depositing the catalyst layer and the protective layer may be repeated sequentially such that the method results in the manufacture of a layer stack comprising the structure Sub:[Cat:Pro]$_n$, wherein Sub corresponds to a substrate, Cat corresponds to the catalyst layer and Pro corresponds to the protective layer, and n is greater than 1. In some embodiments, n may be 2, 3, 4 or 5, or more. In other embodiments, n may be at least 10, 50, 100, 150, 200 or more. Preferably, the catalyst and protective layers are alternately disposed onto the substrate. For example, the layer stack may comprise: (i) a substrate, (ii) a catalyst layer, (iii) a protective layer, (iv) a catalyst layer, and (v) a protective layer, which would be represented by Sub:[Cat:Pro]$_2$, or (i) a substrate, (ii) a catalyst layer, (iii) a protective layer, (iv) a catalyst layer, (v) a protective layer, (vi) a catalyst layer, and (vii) a protective layer, which would be represented by Sub:[Cat:Pro]$_3$, and so on, depending on the required number of layers.

Alternatively, in embodiments where the method comprises depositing a support layer on the substrate the steps of depositing the support layer, catalyst layer and protective layer may be repeated sequentially such that the method results in the manufacture of a layer stack comprising the structure Sub:[Sup:Cat:Pro]$_n$, wherein Sub corresponds to a substrate, Sup corresponds to a support layer, Cat corresponds to the catalyst layer and Pro corresponds to the protective layer, and n is greater than 1. In some embodiments, n may be 2, 3, 4 or 5, or more. In other embodiments, n may be at least 10, 50, 100, 150, 200 or more. For example, the layer stack may comprise: (i) a substrate, (ii) a support layer, (iii) a catalyst layer, (iv) a protective layer, (v) a support layer, (vi) a catalyst layer, and (vii) a protective layer, which would be represented by Sub:[Sup:Cat:Pro]$_2$, or (i) a substrate, (ii) a support layer, (iii) a catalyst layer, (iv) a protective layer, (v) a support layer, (vi) a catalyst layer, (vii) a protective layer, (viii) a support layer, (ix) a catalyst layer, and (x) a protective layer, which would be represented by Sub:[Sup:Cat:Pro]$_3$, and so on, depending on the required number of layers.

The inventors have demonstrated in the Examples that different embodiments of the layer stacks of the invention are highly effective for growing graphene or CNTs thereon.

Hence, according to a third aspect of the invention, there is provided use of the layer stack according to the first aspect, for growing graphene or carbon nanotubes (CNTs).

In addition, according to a fourth aspect, there is provided a method for growing graphene or carbon nanotubes (CNTs), the method comprising:
  a) providing a layer stack comprising a substrate, a protective layer, and an attachment surface disposed therebetween, wherein the protective layer is configured to allow carbon diffusion therethrough to the attachment surface; and
  b) allowing graphene or CNTs to grow from the attachment surface.

Preferably, the layer stack that is used is as defined with respect to the first aspect.

The substrate may itself be capable of catalysing the growth of graphene and/or CNTs. Preferably, where the substrate is capable of catalysing the growth of graphene and/or CNTs the substrate comprises nickel (Ni), copper (Cu), iron (Fe) or steel. However, preferably the layer stack comprises a catalyst layer disposed between the substrate and the protective layer, and capable of catalysing the growth of graphene and/or CNTs. Preferably, the catalyst layer comprises a material selected from a group consisting of: Copper (Cu), Nickel (Ni), Ruthenium (Ru), Cobalt (Co), Iron (Fe), Rubidium (Rd), Platinum (Pt), Iridium (Ir), Palladium (Pd), Rhodium (Rh), carbides, Silver (Ag), Gold (Au), steel or a composite of any two or more of the aforementioned materials. A preferred catalyst layer comprises Fe. The catalyst layer may be between 1 nm and 500 nm in cross-section. Preferably, where the layer stack is intended for growing graphene, the catalyst layer is between 200 nm and 500 nm in cross-section. Alternatively, where the layer stack is intended for growing CNTs the catalyst layer is between 3 nm and 9 nm in cross-section.

The substrate may comprise a material selected from a group consisting of: Silicon (Si), Aluminium Oxide ($Al_2O_3$), Silicon Carbide (SiC), steel, Cu, Ni, plastics, polymers, glass, Gallium Arsenide (GaAs), Al and zeolite. Alternatively, the substrate may comprise a material coated with a 2D layered materials such as Boron Nitride (BN), Molybdenum Disulfide ($MoS_2$), Molybdenum Selenide (MoSe), Tungsten sulphide ($WS_2$), etc. Preferably, the substrate is at least 10 micrometers thick in cross-section, and more preferably is between 10 micrometers and 100 mm in cross-section, or more. For example, for semiconductor applications, the substrate may be about 10 μm to 2 mm, and for larger applications, the substrate may be greater than 50 mm in cross-section.

Preferably, a support layer is disposed between the catalyst layer and the substrate. The support layer may comprise a material selected from a group consisting of: Silicon Dioxide ($SiO_2$), Aluminium Oxide ($Al_2O_3$), Copper (Cu), Aluminium (Al), Tungsten (W), Palladium (Pd), Gold (Au), Silver (Ag), Titanium (Ti), Tantalum (Ta), Tantalum Nitride (TaN) and Titanium Nitride (TiN). The support layer may comprise at least two layers wherein each layer comprises a different composition. For example, the support layer may comprise combinations selected from a group consisting of: TiN/Al, Ti/TiN, Ta/TaN, Ta/TiN, TiN/Ta, Ti/Cu/TiN/Al or Ti/Cu/TiN/Al etc. The support layer may be between 2 nm and 400 nm in cross-section.

Preferably, the protective layer comprises a material selected from a group consisting of: Titanium Nitride (TiN), Titanium (Ti), polyimide, plastics, polytetrafluoroethylene (PTFE), PDMS (Polydimethylsiloxane), Tantalum (Ta), Tantalum Nitride (TaN), Gold (Au), Silver (Ag), Palladium (Pd), Chromium (Cr) and polymers, such as parylene (poly (p-xylylene)) polystyrene, polyacrylate, polyethylene, Polyethylene terephthalate (PET) etc. The protective layer may also be selected from 2D layered materials such as BN, $MoS_2$, MoSe, $WS_2$, etc. Preferably, however, the protective layer comprises Titanium Nitride (TiN). As such, the protective layer may be between 1 nm and 500 nm in cross-section. Preferably, the protective layer is between 1 nm and 100 nm in cross-section. More preferably, the protective layer is between 3.5 nm and 17 nm in cross-section.

The layer stack may comprise the structure Sub:[Cat:Pro]$_n$, wherein Sub corresponds to a substrate, Cat corresponds to the catalyst layer and Pro corresponds to the protective layer, and n is greater than 1. In some embodiments, n may be 2, 3, 4 or 5, or more. In other embodiments, n may be at least 10, 50, 100, 150, 200 or more. Preferably, the catalyst and protective layers are alternately disposed onto the substrate. For example, the layer stack may comprise: (i) a substrate, (ii) a catalyst layer, (iii) a protective layer, (iv) a catalyst layer, and (v) a protective layer, which would be represented by Sub:[Cat:Pro]$_2$, or (i) a substrate, (ii) a catalyst layer, (iii) a protective layer, (iv) a catalyst layer, (v) a protective layer, (vi) a catalyst layer, and (vii) a protective layer, which would be represented by Sub: [Cat:Pro]$_3$, and so on, depending on the required number of layers.

Alternatively, the layer stack may comprise the structure Sub:[Sup:Cat:Pro]$_n$, wherein Sub corresponds to a substrate, Sup corresponds to a support layer, Cat corresponds to the catalyst layer and Pro corresponds to the protective layer, and n is greater than 1. In some embodiments, n may be 2, 3, 4 or 5, or more. In other embodiments, n may be at least 10, 50, 100, 150, 200 or more. For example, the layer stack may comprise: (i) a substrate, (ii) a support layer, (iii) a catalyst layer, (iv) a protective layer, (v) a support layer, (vi) a catalyst layer, and (vii) a protective layer, which would be represented by Sub:[Sup:Cat:Pro]$_2$, or (i) a substrate, (ii) a support layer, (iii) a catalyst layer, (iv) a protective layer, (v) a support layer, (vi) a catalyst layer, (vii) a protective layer, (viii) a support layer, (ix) a catalyst layer, and (x) a protective layer, which would be represented by Sub:[Sup:Cat:Pro]$_3$, and so on, depending on the required number of layers.

Preferably, step (b) of the method of the fourth aspect comprises growing the graphene or CNTs in a chemical vapour deposition (CVD) system. The process can be performed in any form of CVD including thermal CVD (TCVD), plasma enhanced CVD (PECVD) or photothermal CVD (PTCVD). Preferably, PTCVD can be used where optical energy is delivered to the layer stack as infrared radiation, preferably from above the substrate. For example, IR lamps may be used while the layer stack sample is placed on a water-cooled chuck. Preferably, an upper surface of the substrate provided with the layer stack is heated to a temperature of at least 500° C., 600° C., 700° C. or at least 800° C. An upper surface of the substrate provided with the layer stack may be heated up to 1100° C. Preferably, the bulk of the substrate provided with the layer stack remains at a temperature below 600° C., 470° C. or below 250° C. The bulk temperature of the sample may be recorded by a pyrometer disposed towards a lower surface of the substrate. The temperature of the substrate provided with the layer stack may be mainly controlled by the electrical power supplied to the optical lamps, the gases used and pressure of the gases in the chamber. If the power supplied to the chamber is by another means, this will need to be optimised to couple the correct energy to the system. It will be appreciated that the thermal conductivity of the gases in the chamber will also play an important role in the thermal energy kinetics.

Preferably, the growth of graphene or CNTs comprises pre-treating the substrate provided with the layer stack to a substrate bulk temperature below 470° C., preferably in flowing Hydrogen ($H_2$). Other gases such as Argon (Ar), Nitrogen ($N_2$), Helium (He), $NH_3$, etc., can also be used. Plasma assisted or chemical based catalyst pre-treatment may also be used. Preferably, the flowing $H_2$ is delivered at between 25-500 sccm (standard cubic centimeters per minute), most preferably about 100 sccm. Preferably, this step is carried out at a pressure between 0.1 Torr and 7600 Torr, preferably about 2 Torr. Preferably, the preheating step is maintained for about 1-60 minutes, more preferably about 5-15 minutes, most preferably about 10 minutes.

Preferably, in embodiments where graphene is grown, the substrate bulk temperate is between 350-650° C. (preferably with an upper surface temperature of between 550-1100° C.), preferably about 460° C. Alternatively, in embodiments where CNTs are grown, the bulk temperature is preferably in the range of 250-500° C. (preferably with an upper surface temperature between 350-850° C.).

Growth of graphene or CNTs may comprise using a carbon feedstock such as Acetylene ($C_2H_2$), Ethylene ($C_2H_4$), Methane ($CH_4$), Carbon Monoxide (CO), camphor, naphthalene, ferrocene, benzene, ethanol, or any other carbon feedstock. Preferably, the growth of the graphene or CNTs comprises using $C_2H_2$ as the carbon feedstock. Preferably, this is maintained for about 0.1-60 minutes, more preferably about 2-8 minutes, most preferably about 5 min. The carbon feedstock may be delivered between 5-500 sccm. Preferably, the carbon feedstock is delivered at around 10 sccm.

According to a fifth aspect, there is provided a method for patterned graphene and/or CNT growth in a buried catalyst arrangement, the method comprising:
　a) depositing a protective layer on a substrate defining an attachment surface therebetween;
　b) depositing a further layer on the protective layer;

c) lithographically patterning the further layer;
d) carrying out etching of the further layer; and
e) allowing graphene/CNTs to grow on the attachment surface.

The attachment surface for the graphene or CNTs may be disposed adjacent the protective layer. The substrate may itself be capable of catalysing the growth of the graphene and/or CNTs from the attachment surface.

In this embodiment, the phrase "buried catalyst" can refer to an arrangement where the substrate, which is capable of catalysing the growth of the graphene and/or CNTs, is provided underneath a further layer, where the further layer is configured to be lithographically patterned.

However, in a preferred embodiment, a catalyst layer may be deposited on the substrate, prior to the deposition of the protective layer, wherein the catalyst layer is capable of catalysing the growth of the graphene and/or the CNTs from the attachment surface.

In this embodiment, the phrase "buried catalyst" can refer to an arrangement where the catalyst is provided underneath a further layer, where the further layer is configured to be lithographically patterned.

In one embodiment the method according to the fifth aspect is used for patterned graphene growth only. In an alternative embodiment the method according to the fifth aspect is used for patterned CNT growth only. In a further alternative embodiment the method according to the fifth aspect is used for combined patterned CNT and graphene growth together. The combined patterned CNT and graphene growth may comprise multi-level combined patterned CNT and graphene growth. The layer stack may be configured such that the resulting CNTs and graphene are configured to act as horizontal and vertical interconnects.

The further layer may be a dielectric such as Silicon Dioxide ($SiO_2$), F-doped oxides (SiO:F), C-doped oxides (SiO:C), SOG (spin on glass), polymers (polyimides, aromatic polymers, parylene, PTFE, etc or a metal such as Cu, Al, W, Au, Ag, etc. The further layer may be between 1 nm to 500 nm in cross-section. Alternatively, the further layer may be more than 500 nm in cross-section. The further layer is preferably silicon dioxide.

The substrate may comprise a material selected from a group consisting of: Silicon (Si), Aluminium Oxide ($Al_2O_3$), Silicon Carbide (SiC), steel, Al, Ni, Cu, plastics, polymers, glass, Gallim Arsenide (GaAs) and zeolite. Alternatively, the substrate may comprise a material coated with a 2D layered materials such as Boron Nitride (BN), Molybdenum Disulfide ($MoS_2$), Molybdenum Selenide (MoSe), Tungsten sulphide ($WS_2$), etc. Preferably, the substrate comprises silicon. Alternatively, where the substrate is capable of catalysing the growth of graphene and/or CNTs the substrate comprises nickel (Ni), copper (Cu), iron (Fe) or steel.

Preferably, the method comprises depositing a support layer on the substrate, preferably before the catalyst layer has been deposited. Preferably, the support layer comprises a material selected from a group consisting of: Silicon Dioxide ($SiO_2$), Aluminium Oxide ($Al_2O_3$), Copper (Cu), Aluminium (Al), Tungsten (W), Palladium (Pd), Gold (Au), Silver (Ag), Titanium (Ti), Tantalum (Ta), Tantalum Nitride (TaN) and Titanium Nitride (TiN). The support layer may comprise at least two layers wherein each layer comprises a different composition. For example, the support layer may comprise combinations selected from a group consisting of: TiN/Al, Ti/TiN, Ta/TaN, Ta/TiN, TiN/Ta or Ti/Cu/TiN/Al etc. The support layer may be between 2 nm and 400 nm in cross-section.

Preferably, the catalyst layer comprises Copper (Cu), Nickel (Ni), Ruthenium (Ru), Cobalt (Co), Iron (Fe), Rubidium (Rd), Platinum (Pt), Iridium (Ir), Palladium (Pd), Rhodium (Rh), carbides, Silver (Ag), Gold (Au), steel or a composite of any two or more of the aforementioned materials. A preferred catalyst layer comprises Fe. Preferably, the catalyst layer comprises a film of 1 nm to 500 nm in cross section. Preferably, where the layer stack is intended for growing graphene, the catalyst layer is between 200 nm and 500 nm in cross-section. Alternatively, where the layer stack is intended for growing CNTs the catalyst layer is between 3 nm and 9 nm in cross-section. In a preferred embodiment the catalyst later comprises a film of around 3 nm in cross-section.

Preferably, the protective layer comprises a material selected from a group consisting of: Titanium Nitride (TiN), Titanium (Ti), polyimide, plastics, polytetrafluoroethylene (PTFE), PDMS (Polydimethylsiloxane), Tantalum (Ta), Tantalum Nitride (TaN), Gold (Au), Silver (Ag), Palladium (Pd), Chromium (Cr) and polymers, such as parylene (poly (p-xylylene)) polystyrene, polyacrylate, polyethylene, Polyethylene terephthalate (PET) etc. The protective layer may also be selected from 2D layered materials such as BN, $MoS_2$, MoSe, $WS_2$, etc. Preferably, the protective layer comprises Titanium Nitride (TiN). Preferably, the protective layer comprises a film of 1 nm-500 nm in cross-section. More preferably, the protective layer is between 3.5 nm and 17 nm in cross-section. In a preferred embodiment, the protective layer comprises a film of around 7 nm in cross-section.

The layers could be cluster source deposited, electron beam evaporated, thermally evaporated, solution deposited, solution evaporated, ion implanted, spin coated, chemical vapour deposited, plasma chemical vapour deposited, plasma immersion deposited or electrodeposited. Preferably, the or each further layer, support layer, catalyst layer and/or protective layer is sputter deposited. The different layers are preferably deposited sequentially onto the substrate in an inert environment without breaking vacuum. Thus, advantageously exposure of the catalyst layer to the atmosphere is avoided.

Preferably, the etching comprises reactive ion etching or wet chemicals etching using gaseous etchants such as $CF_4$, $SF_6$, $O_2$, $NH_3$, $CHF_3$, $Cl_2$, Hydrogen Bromide (HBr), Boron trichloride ($BCl_3$), $CHCl_3$ etc., or wet chemicals such as HCl, $HNO_3$, $H_2O_2$, $NH_4OH$, HF, BHF, KOH, NaOH, $CH_3COOH$, $H_3PO_4$, etc. Preferably, the etching comprises reactive ion etching and the etchant comprises $CF_4$ delivered at between 5-200 sccm, most preferably about 30 sccm, together with Ar delivered at between 5-500 sccm, most preferably about 10 sccm. Preferably step (d) of the method of the fifth aspect is maintained for about 1-60 minutes, more preferably about 5-15 minutes, most preferably about 10 minutes. Preferably step (d) of the method of the fifth aspect is performed at between 30-150 mTorr pressure, most preferably about 60 mTorr pressure, and at between 50-200 watt RF Power, most preferably about 100 watt RF power.

Preferably, step (e) of the method of the fifth aspect can be performed in any form of CVD including thermal CVD (TCVD), plasma enhanced CVD (PECVD) or photothermal CVD (PTCVD). Preferably, step (e) is performed in a photo-thermal chemical vapour deposition (PTCVD) system. Preferably, optical energy is delivered to the layer stack as infrared radiation, preferably from above the substrate. For example, IR lamps may be used while the layer stack sample is placed on a water-cooled chuck. Preferably, an upper surface of the substrate provided with the layer stack is heated to a temperature of at least 500° C., 600° C., 700° C. or at least 800° C. An upper surface of the substrate provided with the layer stack may be heated up to 1100° C. Preferably, the bulk of the substrate provided with the layer stack remains at a temperature below 650° C., 470° C., or below 250° C. The bulk temperature of the sample may be recorded by a pyrometer disposed towards a lower surface of the substrate. The temperature of the substrate provided with the layer stack may be mainly controlled by the electrical power supplied to the optical lamps, the gases used and pressure of the gases in the chamber. It will be appreciated that the thermal conductivity of the gases in the chamber will also play an important role in the thermal energy kinetics. If the power supplied to the chamber is by another means, this will need to be optimised to couple the correct energy to the system.

Preferably, the growth of graphene and/or CNTs comprises pre-treating the substrate provided with the layer stack to a substrate bulk temperature below 470° C., preferably in flowing $H_2$. Other gases such as Ar, $N_2$, He, $NH_3$, etc., can also be used. Plasma assisted or chemical based catalyst pre-treatment may also be used. Preferably, the bulk temperature is between 250° C.-650° C. Preferably, the flowing $H_2$ is delivered at between 25-500 sccm (standard cubic centimeters per minute), most preferably about 100 sccm. Preferably, this step is carried out at a pressure of about 0.1-7600 Torr, preferably about 2 Torr. Preferably, the pre-heating step is maintained for about 1-60 minutes, more preferably about 5-15 minutes, most preferably about 10 minutes.

Preferably, the growth of the graphene and/or CNTs is carried out using a carbon feedstock, such as $C_2H_2$, $C_2H_4$, $CH_4$, CO, $CO_2$, camphor, naphthalene, Ferrocene, benzene, ethanol, or any other carbon feedstock can also be used. Preferably, the growth of the graphene and/or CNTs according to the method of the fifth aspect comprises using $C_2H_2$ as the carbon feedstock. Preferably, this is maintained for about 1-60 minutes, more preferably about 2-8 minutes, most preferably about 5 min. Preferably, the carbon feedstock may be delivered between 5-500 sccm. Preferably, the carbon feedstock is delivered at around 10 sccm.

Preferably, the fabrication of graphene and/or CNT comprises a final step:
    f) depositing and patterning of a top layer.

The top layer may comprise a dielectric such as $SiO_2$, F-doped oxides (SiO:F), C-doped oxides (SiO:C), SOG (spin on glass), polymers, such as polyimides, aromatic polymers, parylene, PTFE, etc., or a metal such as Cu, Al, W, Au, Ag, etc. Preferably the top layer comprises an Al film. The Al film may be configured to act as a top metal contact. The top layer can be 10-1000 nm in cross-section. The top layer preferably is about 300 nm in cross-section.

According to a sixth aspect, there is provided a method for growing carbon nanotubes (CNTs), the method comprising:
    a) providing a layer stack comprising a substrate, a protective layer, and an attachment surface disposed therebetween, wherein the protective layer is configured to allow carbon diffusion therethrough to the attachment surface; and
    b) allowing CNTs to grow from the attachment surface, and separate at least a portion of the protective layer from the layer stack.

Using this method, 3D structures are created.

In a preferred embodiment, the CNT growth causes the portion of the protective layer to separate from the attachment surface. Hence, in a preferred embodiment, the resulting structure comprises CNTs sandwiched between the attachment surface and the protective layer.

Alternatively, the protective layer comprises at least two sublayers, and the CNT growth may cause a first protective sublayer to separate from a second protective sublayer. Hence, in this embodiment, the resulting structure comprises CNTs sandwiched between the attachment surface and the first protective sublayer, and the second protective sublayer remains adjacent to the attachment surface.

Preferably, the layer stack that is used in the method of the sixth aspect is as defined with respect to the first aspect.

Preferably, the protective layer comprises at least one material selected from a group consisting of: Titanium Nitride (TiN), Titanium (Ti), polyimide, plastics, polytetrafluoroethylene (PTFE), PDMS (Polydimethylsiloxane), Tantalum (Ta), Tantalum Nitride (TaN), Gold (Au), Silver (Ag), Palladium (Pd), Chromium (Cr) and polymers, such as parylene (poly(p-xylylene)) polystyrene, polyacrylate, polyethylene, Polyethylene terephthalate (PET) etc. The protective layer may also be selected from 2D layered materials such as BN, $MoS_2$, MoSe, $WS_2$, etc. Preferably, however, at least the portion of the protective layer which becomes separated from the layer stack comprises a polymeric material. As such, the protective layer may be between 1 nm and 500 nm in cross-section. Preferably, the protective layer is between 1 nm and 100 nm in cross-section. More preferably, the protective layer is between 3.5 nm and 17 nm in cross-section.

Preferably, the method of growing the CNTs comprises using the method of the fourth aspect.

The inventors have demonstrated in the Examples that the layer stack could be used for the combined growth of graphene and CNTS, which may act as horizontal and vertical interconnects.

Hence, according to a seventh aspect there is provided a method for the manufacture of a graphene and/or CNT based integrated circuit or printed circuit board interconnnect, wherein the method comprises:
    a) providing a plurality of layer stacks as defined with respect to the first aspect; and
    b) growing the graphene and/or CNTs from the attachment surfaces such that the graphene and/or CNTs are configured to act as a horizontal and vertical interconnect.

Preferably, patterning of the CNTs and graphene is performed as defined with respect to the fifth aspect. Preferably, 3D structuring of CNTs is performed as defined with respect to the sixth aspect. Preferably, the CNTs and/or graphene are grown using the method of the fourth aspect.

Preferably, the plurality of layer stacks is configured to allow the combined growth of graphene and CNTs.

Example 8 describes use of the methodology to grow CNTs or graphene into cavities within a layer stack system.

Thus, according to an eighth aspect of the invention, there is provided a layer stack for growing graphene or carbon nanotubes (CNTs), wherein the layer stack comprises a substrate, a protective layer, a cavity provided within the layer stack, and an attachment surface, wherein the protective layer is configured to allow carbon diffusion therethrough to both the cavity and the attachment surface, such that graphene or CNTs grow from the attachment surface.

In one embodiment, the attachment surface for the CNTs or graphene is disposed within the cavity, opposite the protective layer. The substrate may itself be capable of catalysing the growth of the CNTs or graphene from the attachment surface.

Hence, in one embodiment, the layer stack comprises a substrate, wherein the substrate defines an indentation in a surface thereof, a protective layer disposed adjacent the substrate and over the indentation to form a cavity. In this embodiment, the attachment surface for the graphene or CNT growth is preferably disposed within the cavity opposite the protective layer.

In a preferred embodiment the layer stack comprises an additional layer disposed between the substrate and the protective layer, wherein the additional layer defines an indentation and the protective layer is disposed over the indentation to form the cavity.

Hence, in a preferred embodiment, the layer stack comprises a substrate, an additional layer disposed adjacent the substrate, wherein the additional layer and the substrate define an indentation, a protective layer disposed adjacent the additional layer and over the indentation to form a cavity. In this embodiment, the attachment surface for the graphene or CNT growth is preferably disposed within the cavity opposite the protective layer.

Preferably the layer stack comprises a catalyst layer disposed on the opposite side of the cavity to the protective layer, wherein the catalyst layer is capable of catalysing the growth of the CNTs or graphene from the attachment surface.

Hence, in a preferred embodiment, the layer stack comprises a substrate, a catalyst layer disposed adjacent the substrate, an additional layer disposed adjacent the catalyst layer, wherein the additional layer and catalyst layer define an indentation, and a protective layer disposed adjacent the additional layer and over the indentation to form a cavity. In this embodiment, the attachment surface for the CNT growth is preferably disposed within the cavity, adjacent the catalyst layer.

Preferably, the layer stack comprises a support layer disposed between the catalyst layer and the substrate.

Hence, in a preferred embodiment, the layer stack comprises a substrate, a support layer disposed adjacent the substrate, a catalyst layer disposed adjacent the support layer, an additional layer disposed adjacent the catalyst layer, wherein the additional layer and catalyst layer define an indentation, and a protective layer disposed adjacent the additional layer and over the indentation to form a cavity. In this embodiment, the attachment surface for the CNT or graphene growth is preferably disposed within the cavity, adjacent the catalyst layer.

Preferably, the layer stack comprises two protective layers, wherein the first protective layer is disposed between the catalyst layer and the additional layer, and the second protective layer is disposed over the indentation, defined by the additional layer, to form the cavity.

Hence, in a preferred embodiment, the layer stack comprises a substrate, an optional support layer disposed adjacent the substrate, a catalyst layer disposed adjacent the support layer where provided, or in embodiments where the support layer is not provided the catalyst layer will be disposed adjacent the substrate, a first protective layer disposed adjacent the catalyst layer, an additional layer disposed adjacent the first protective layer, wherein the additional layer and first protective layer define an indentation, and a second protective layer disposed adjacent the additional layer and over the indentation to form a cavity. In this embodiment, the attachment surface for the CNT or graphene growth is preferably disposed adjacent the catalyst layer.

In an alternative embodiment, the layer stack comprises a catalyst layer disposed between the protective layer and the cavity wherein the catalyst layer is capable of catalysing the growth of the CNTs or graphene from the attachment surface.

Hence, in an alternative embodiment, the layer stack comprises a substrate, wherein the substrate defines an indentation in a surface thereof, a catalyst layer disposed adjacent the substrate and over the indentation to form a cavity, and a protective layer disposed adjacent the catalyst layer. In this embodiment, the attachment surface for the CNT or graphene growth is preferably disposed within the cavity, adjacent the catalyst layer.

In a preferred embodiment the layer stack comprises an additional layer disposed between the substrate and the protective layer, wherein the additional layer defines an indentation, and the catalyst layer is disposed over the indentation to form the cavity.

Hence, in a preferred embodiment, the layer stack comprises a substrate, an additional layer disposed adjacent the substrate, wherein the additional layer and the substrate define an indentation, a catalyst layer disposed adjacent the additional layer and over the indentation to form a cavity, and a protective layer disposed adjacent the catalyst layer. In this embodiment, the attachment surface for the CNT or graphene growth is preferably disposed within the cavity, adjacent the catalyst layer.

In a further alternative embodiment the layer stack comprises two attachment surfaces. Preferably the two attachment surfaces are provided on opposite sides of the cavity. Preferably, where two attachment surfaces are provided within the layer stack the first attachment surface is adjacent to a first catalyst layer and the second attachment surface is adjacent to a second catalyst layer.

Hence, in a further alternative embodiment, the layer stack comprises a substrate, a first catalyst layer disposed adjacent the substrate, an additional layer disposed adjacent the first catalyst layer, wherein the additional layer and first catalyst layer define an indentation, a second catalyst layer disposed adjacent the additional layer and over the indentation to form a cavity, and a protective layer disposed adjacent the second catalyst layer. In this embodiment, the first attachment surface for the CNT or graphene growth is preferably disposed within the cavity, adjacent the first catalyst layer, and the second attachment surface for the CNT or graphene growth is preferably disposed with the cavity, adjacent the second catalyst layer.

Preferably, the layer stack comprises a support layer disposed between the first catalyst layer and the substrate.

Preferably, the layer stack comprises three protective layers, wherein the first protective layer is disposed between the first catalyst layer and the additional layer and the second protective layer is disposed between the additional layer and second catalyst layer and the third protective layer is disposed adjacent the second catalyst layer.

Hence, in a preferred embodiment, the layer stack comprises a substrate, a support layer disposed adjacent the substrate, a first catalyst layer disposed adjacent the support layer, a first protective layer disposed adjacent the first catalyst layer, an additional layer disposed adjacent the first protective layer, wherein the additional layer and first protective layer define an indentation, a second protective layer disposed adjacent the additional layer and over the indentation to form a cavity, a second catalyst layer disposed adjacent the second protective layer and a third protective layer disposed adjacent the second catalyst layer. In this embodiment, the first attachment surface for the CNT or graphene growth is preferably disposed, between the first catalyst layer and first protective layer, and the second attachment surface for the CNT or graphene growth is preferably disposed between the second catalyst layer and second protective layer.

The additional layer may comprise a material selected from a group consisting of: Silicon (Si), Aluminium Oxide ($Al_2O_3$), Silicon Carbide (SiC), steel, Copper (Cu), Nickel (Ni), plastics, polymers, glass, Gallium Arsenide (GaAs), Aluminium (Al), zeolite and Silicon Dioxide ($SiO_2$). Preferably the additional layer comprises Silicon Dioxide. The additional layer may be at least 1 nm in cross-section. Preferably, the additional layer is between 1 nm and 1000 nm in cross-section, and more preferably is about 500 nm in cross-section.

Preferably, the layer stack of the eighth aspect is as defined with respect to the first aspect.

According to a ninth aspect of the invention, there is provided use of the layer stack according to the eighth aspect, for growing graphene or carbon nanotubes (CNTs).

All features described herein (including any accompanying claims, abstract and drawings), and/or all of the steps of any method or process so disclosed, may be combined with any of the above aspects in any combination, except combinations where at least some of such features and/or steps are mutually exclusive.

For a better understanding of the invention, and to show how embodiments of the same may be carried into effect, reference will now be made, by way of examples, to the accompanying Figures, in which:—

Figure 2:
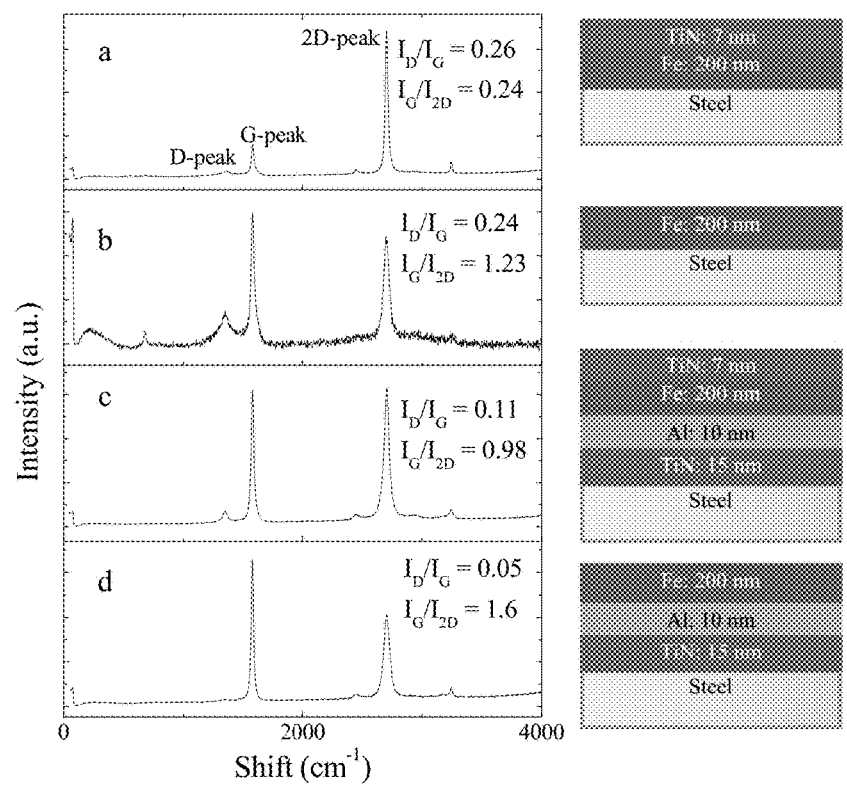
Figure 3:
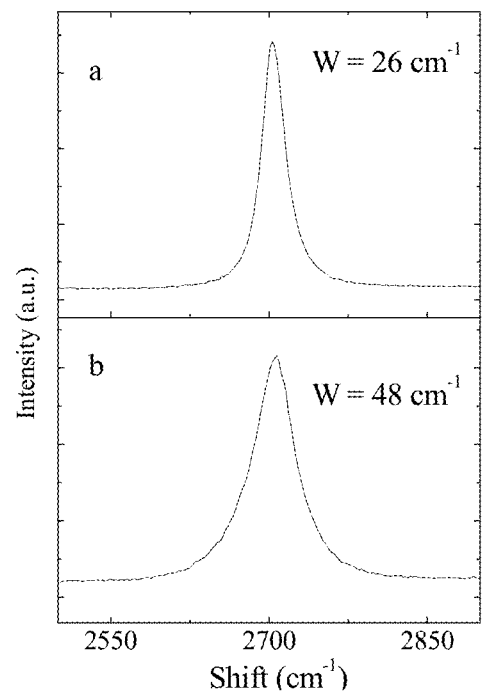
Figure 5:
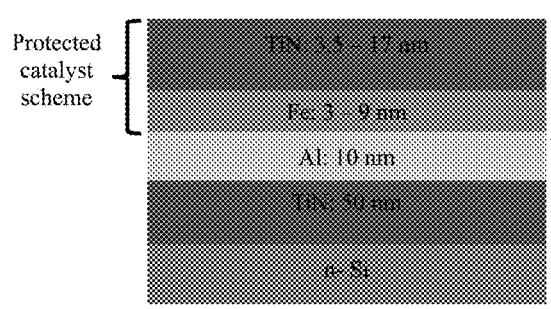
Figure 6:
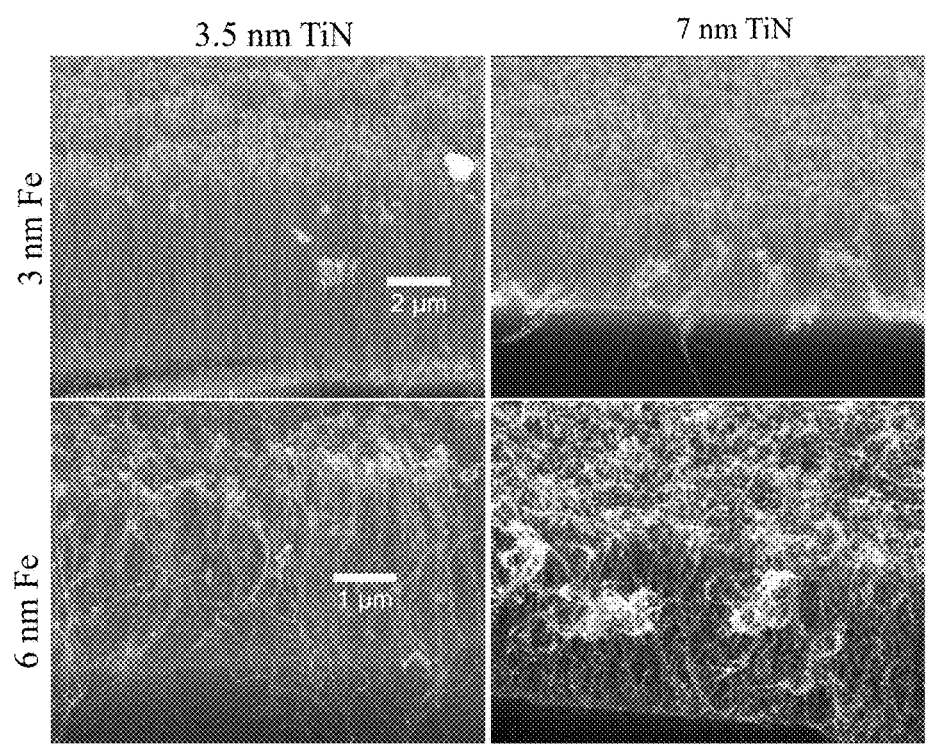
Figure 7:
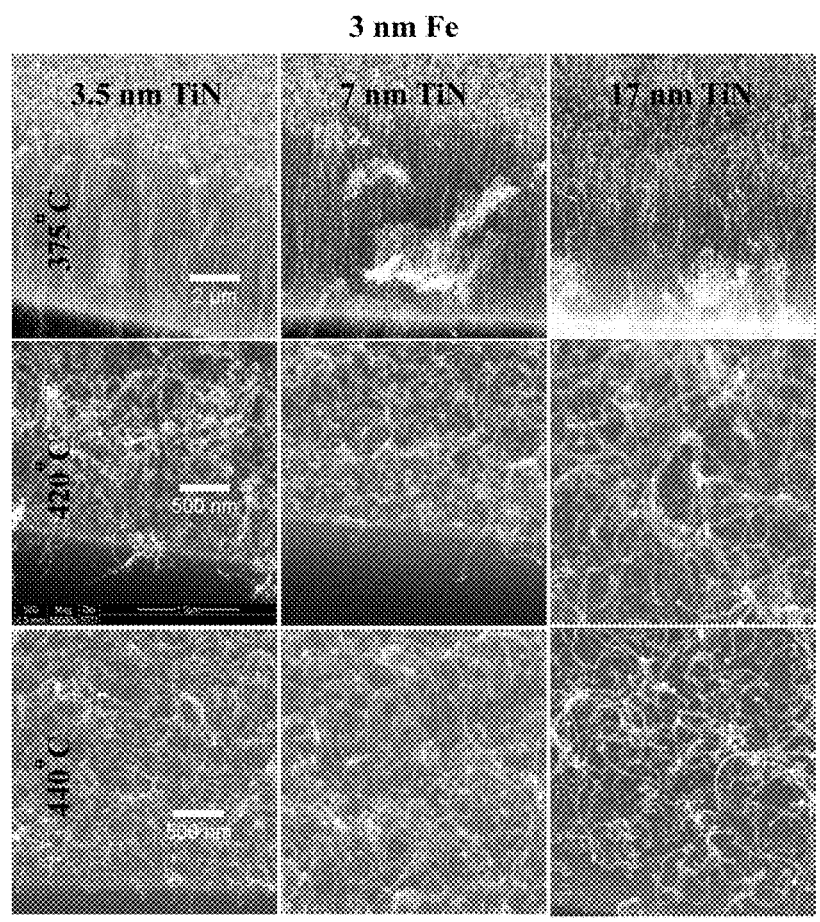
Figure 8:
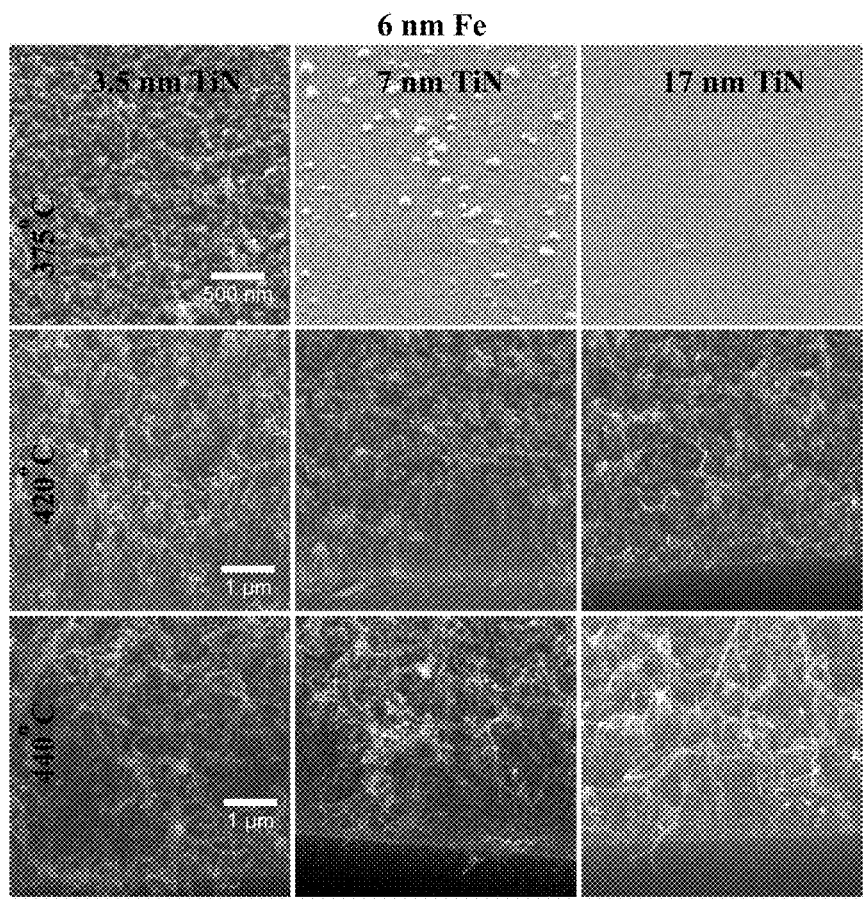
Figure 9:
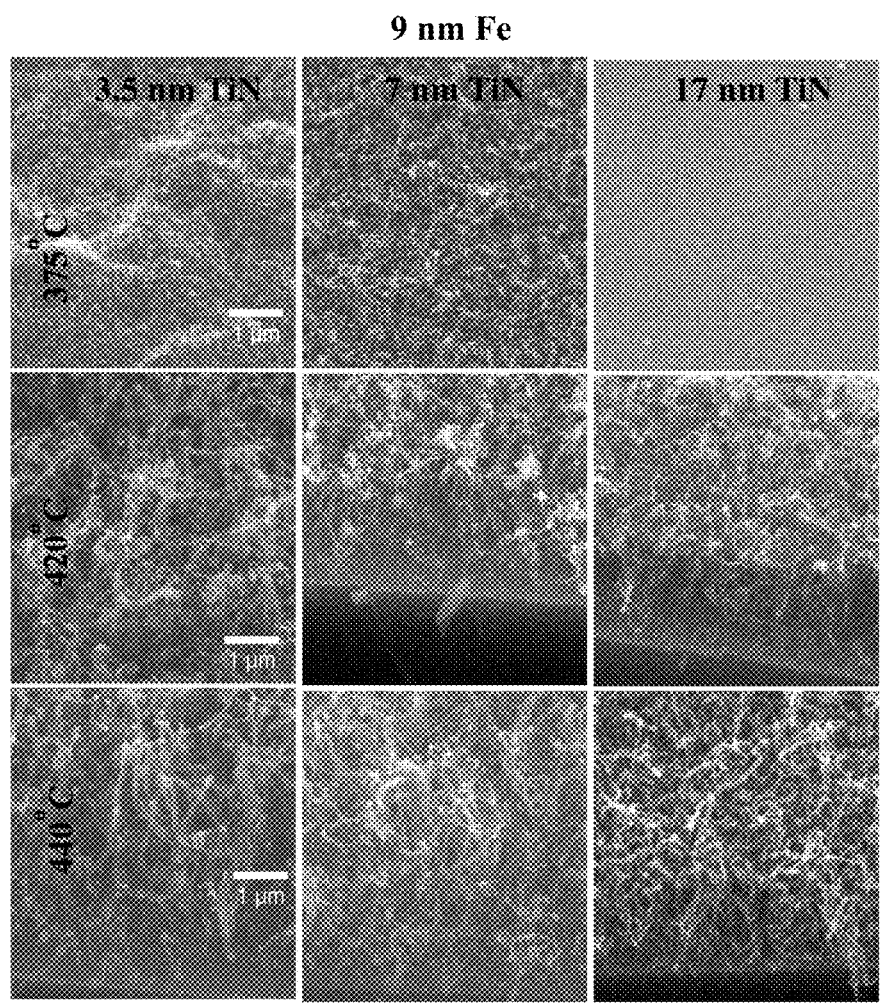
Figure 10:
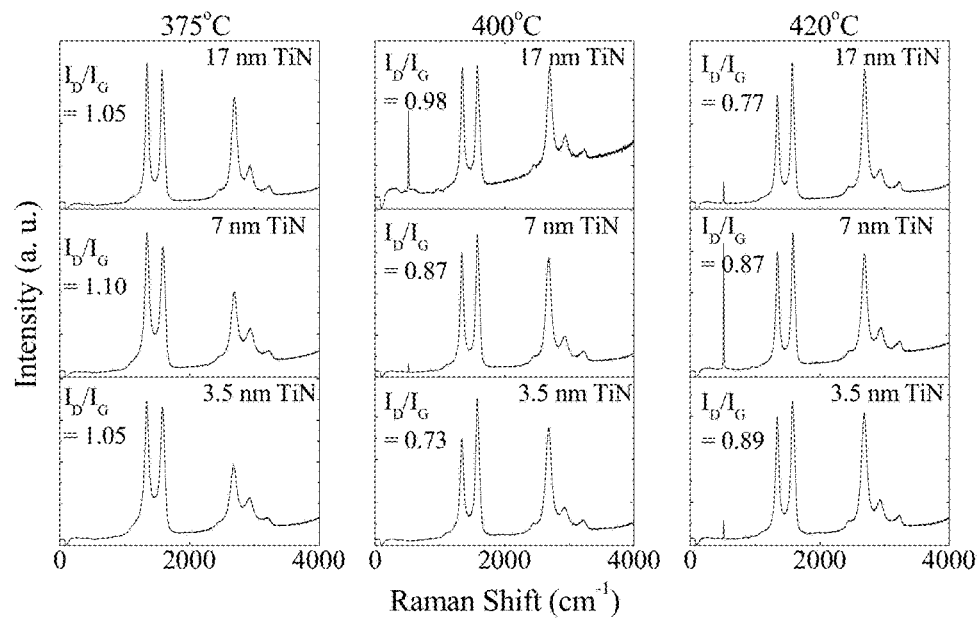
Figure 14:
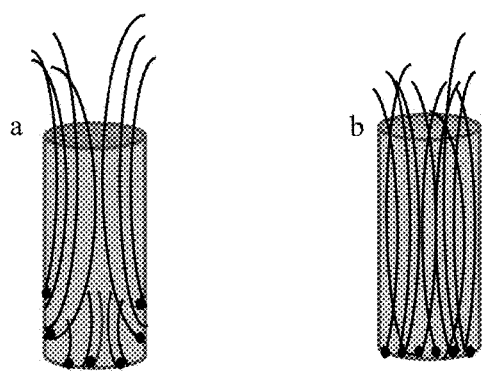
Figure 15:
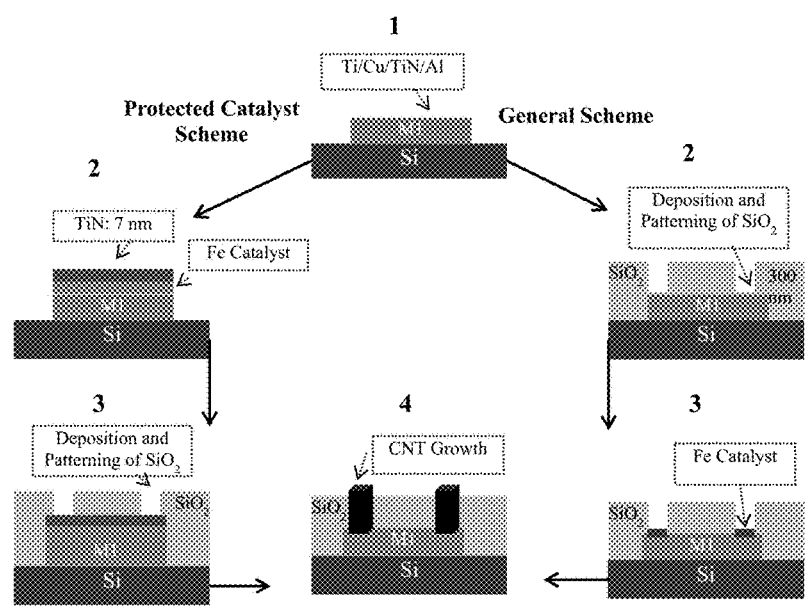
Figure 16:
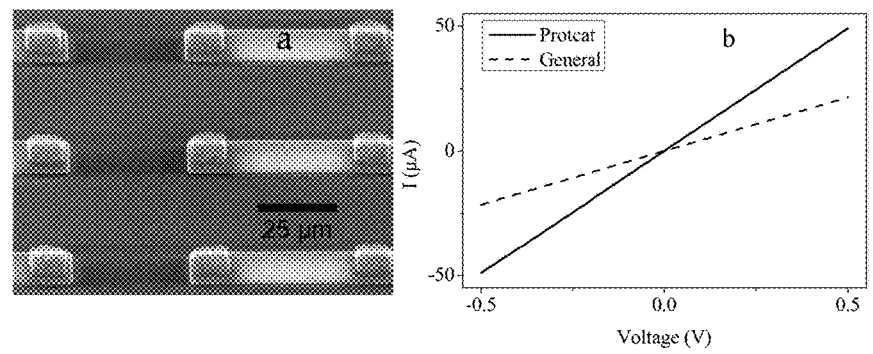
Figure 17:
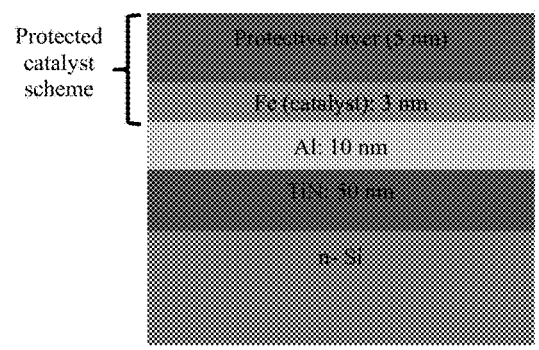
Figure 18:
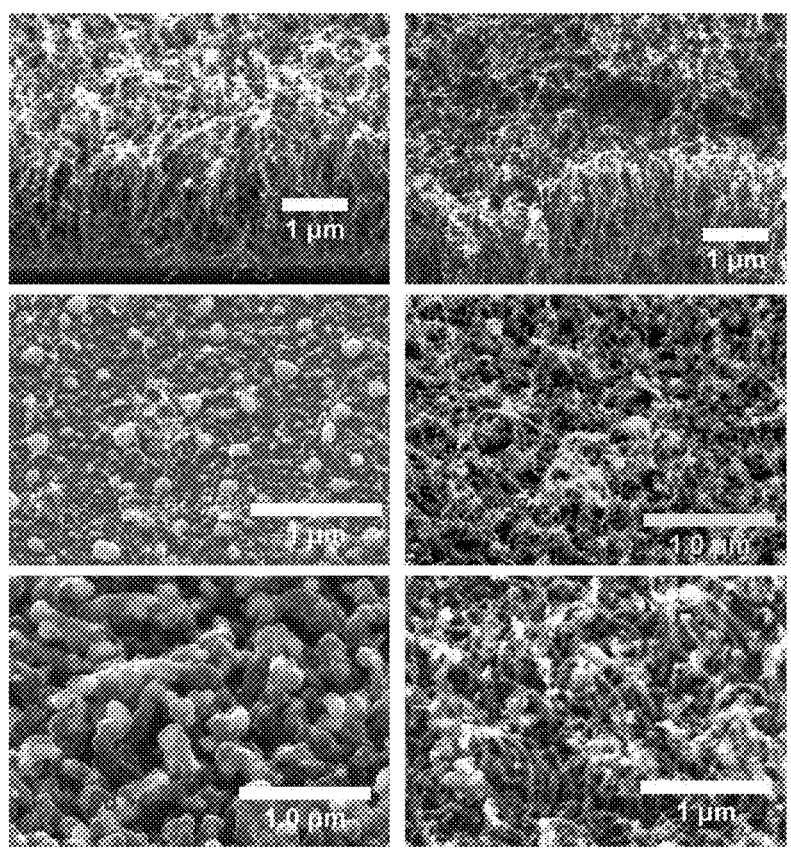
Figure 19:
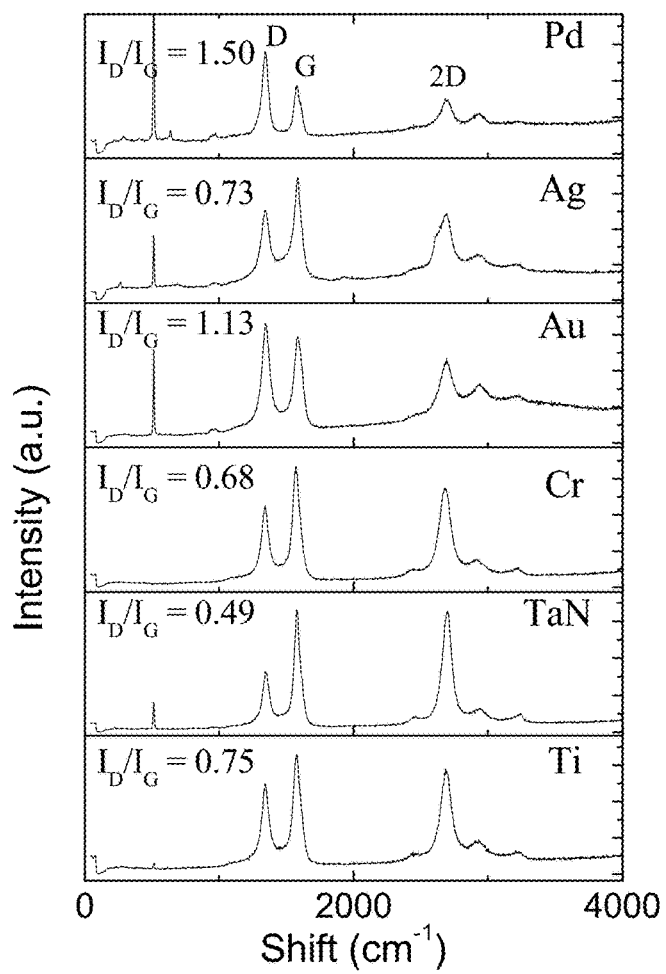
Figure 20:
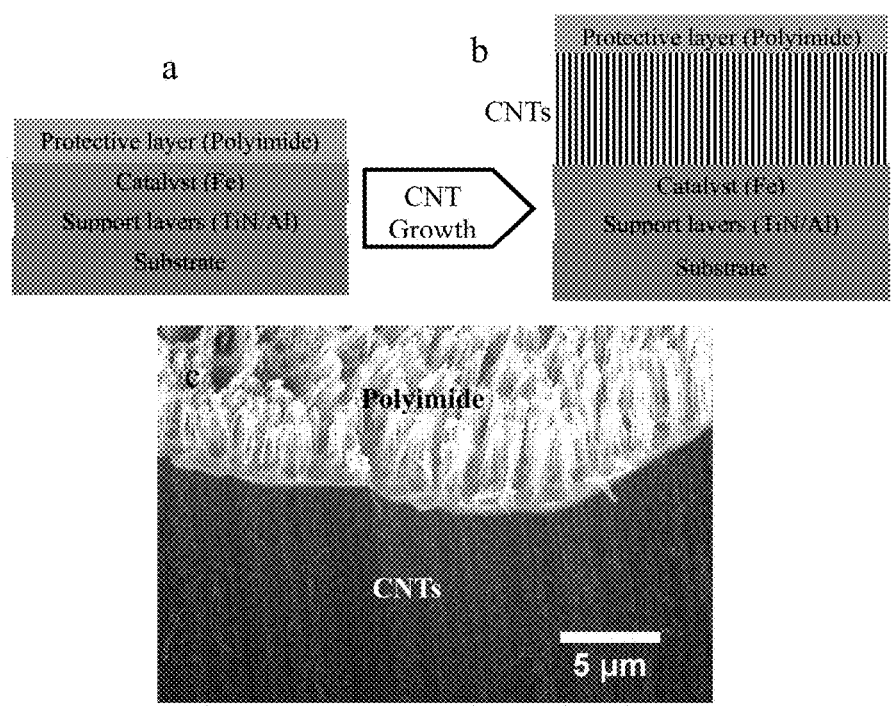
Figure 21:
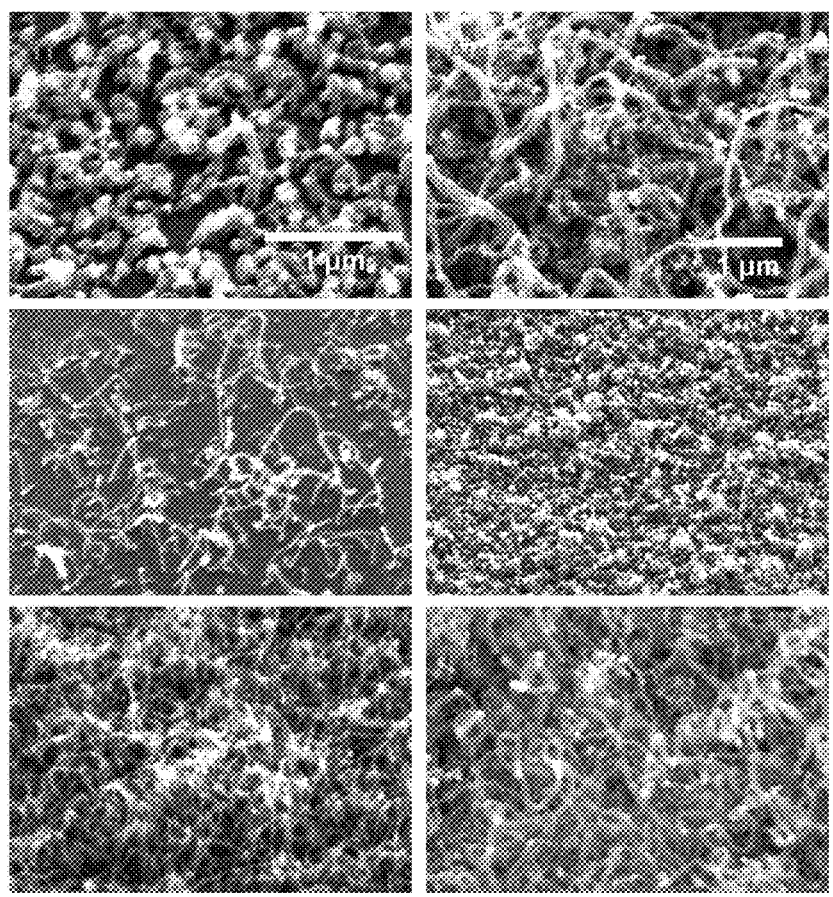
Figure 22:
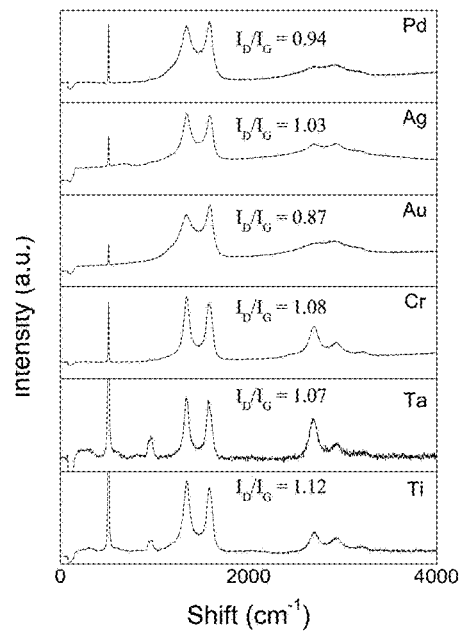

FIG. 2a-d are graphs (on the left) showing the Raman spectra (514 nm laser wavelength) of as-grown graphene on steel substrates and corresponding schematic layer structures (on the right);

FIG. 3a-b are graphs showing the magnified 2D-peaks of FIGS. 2a and 2c;

FIG. 4a-c are graphs showing the Raman spectra (514 nm laser wavelength) of as-grown graphene on Si substrates and corresponding schematic layer structures;

FIG. 5 shows a layer structure of another embodiment of the protected-catalyst scheme of the invention;

FIG. 6 shows scanning electron microscope (SEM) images of CNTs grown at 400° C., using the protected-catalyst scheme, where the samples shown consist of 3 nm or 6 nm of Iron (Fe) film protected by 3.5 nm or 7 nm of Titanium Nitride (TiN) film, as indicated on the images, the scale bar in a row is the same for both images;

FIG. 7 shows SEM images of CNTs grown using the protected-catalyst scheme, where the samples shown consist of 3 nm Fe film, protected by a TiN film of thicknesses: 3.5 nm, 7 nm or 17 nm and the growth of CNTs is carried out in the substrate bulk temperature range of 375-440° C., as indicated on the images, the scale bar in a row is the same for all images;

FIG. 8 shows SEM images of CNTs grown using protected-catalyst scheme, where the samples consist of 6 nm of Fe film, protected by TiN film of thicknesses: 3.5 nm, 7 nm and 17 nm and the growth of CNTs is carried out in the substrate bulk temperature range of 375-440° C., as indicated on the images, the scale bar in a row is the same for all images;

FIG. 9 shows SEM images of CNTs grown using the protected-catalyst scheme, where the samples shown consist of 9 nm of Fe film, protected by TiN film of thicknesses: 3.5 nm, 7 nm and 17 nm and the growth of CNTs is carried out in the substrate bulk temperature range of 375-440° C., as indicated on the images, the scale bar in a row is the same for all images;

FIG. 10 shows a number of graphs which show the Raman spectra of the CNTs grown on 3 nm Fe protected by TiN film of 3.5 nm, 7 nm and 17 nm at various temperatures;

FIG. 11a shows an SEM micrograph of CNTs grown using the general approach taught in the prior art by depositing 3 nm Fe on TiN/Al structure before sonication;

FIG. 11b shows an SEM micrograph of a sample of FIG. 10a subsequent to the sample being placed in a sonication bath for 1 minute using 100% power of the sonicator;

FIG. 11c shows an SEM micrograph of a sample where CNTs were grown on 3 nm Fe catalyst protected with 3.5 nm TiN layer and the sample was subsequently placed in a sonication bath for 1 minute using 100% power of the sonicator;

FIG. 11d shows a magnified image of the sample of FIG. 10c;

FIG. 11e shows an SEM micrograph of a sample where CNTs were grown on 3 nm Fe protected with 7 nm TiN and the sample was subsequently placed in a sonication bath for 1 minute using 100% power of the sonicator;

FIG. 11f shows a magnified image of the sample of FIG. 10e;

FIG. 12a is a schematic of proposed adhesion improvement mechanism in the protected catalyst scheme for CNTs;

FIG. 12b is a schematic of the proposed adhesion improvement mechanism in the protected catalyst scheme for graphene;

FIG. 13a is a schematic layer structure where 6 nm Fe is capped with a 100 nm TiN layer, both of which are deposited over TiN/Al (50/10 nm) layers and the structure is patterned using a lift-off process;

FIG. 13b is a cross-sectional SEM image (tilted 45°) where CNTs are grown using the protected catalyst scheme on patterned squares;

FIG. 13c is a magnified image of the cross-sectional SEM image of FIG. 13b;

FIG. 13d is a further magnified image of the cross-sectional SEM image of FIGS. 13b and 13c;

FIG. 14a is an illustration of CNT growth as a result of side-wall deposition of catalyst;

FIG. 14b is an illustration of the desired CNT growth where all tubes originate from the bottom surface of a via at a the highest possible density;

FIG. 15 is a schematic of the process flow for the fabrication of CNT based vias using the protected catalyst scheme and general scheme adopted in the prior art;

FIG. 16a is an SEM micrograph of CNTs grown in vias using protected catalyst scheme;

FIG. 16b is a graph showing the current-voltage characteristics of 100 CNT based vias in a chain structure fabricated through protected catalyst scheme and the vias fabricated through general scheme adopted in the prior art;

FIG. 16c is a schematic showing how a protected catalyst scheme can be used to grow a combination of graphene and CNTs to act as horizontal and vertical interconnects respectively;

FIG. 17 shows a protected catalyst scheme according to one embodiment of the invention for the growth of CNTs where the catalyst is protected by a capping or protective layer which comprises a film of Ti, TaN, Cr, Au, Ag or Pd;

FIG. 18 shows SEM images of CNTs grown using the protected catalyst scheme of FIG. 17 in a photothermal CVD (chemical vapour deposition) system;

FIG. 19 shows Raman spectra of CNTs grown using the protected catalyst scheme of FIG. 17 in a photothermal CVD system;

FIG. 20a is a schematic showing a layer stack used for growing CNTs;

FIG. 20b is a schematic showing the layer stack of FIG. 20b where the polyimide protective layer has been lifted due to the growth of CNTs;

FIG. 20c is an SEM image showing the polyimide protective layer lifted-up with the growth of the CNTs;

FIG. 21 shows SEM images of CNTs grown using the protected catalyst scheme of FIG. 17 in a thermal CVD system;

FIG. 22 shows Raman spectra of CNTs grown using the protected catalyst scheme of FIG. 17 in a thermal CVD system;

FIG. 23a is a schematic showing a layer stack intended for use in growing CNTs or graphene, with a cavity provided within the layer stack;

FIG. 23b is a schematic showing the layer stack of FIG. 23a wherein CNTs have been grown to fill the cavity;

FIG. 24a is a schematic showing an alternative embodiment of a layer stack intended for use in growing CNTs or graphene, with a cavity provided within the layer stack; and FIG. 24b is a schematic showing the layer stack of FIG. 24a wherein CNTs have been grown to fill the cavity.

Figure 25:
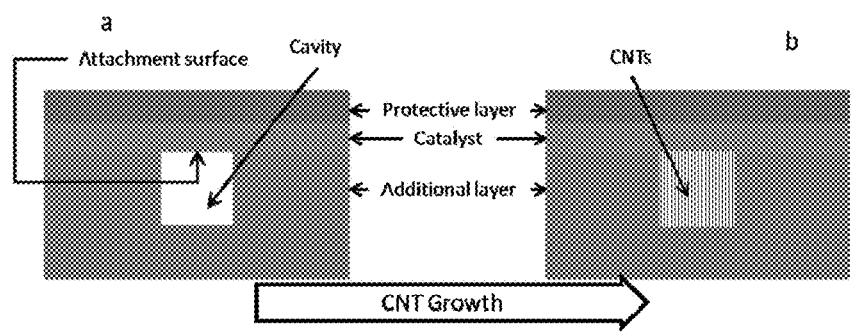

FIG. 25a is a schematic showing an alternative embodiment of a layer stack intended for use in growing CNTs or graphene, with a cavity provided within the layer stack;

FIG. 25b is a schematic showing the layer stack of FIG. 25a wherein CNTs have been grown to fill the cavity;

FIG. 26a is a schematic showing an alternative embodiment of a layer stack intended for use in growing CNTs or graphene, with a cavity provided within the layer stack; and FIG. 26b is a schematic showing the layer stack of FIG. 26a wherein CNTs have been grown to fill the cavity.

EXAMPLES

The inventors have developed a process called the "protected catalyst scheme" where a catalyst is capped with an outer protective layer. The protective layer may consist of, but is not limited to, materials such as Titanium Nitride (TiN), Titanium (Ti), polyimide, Tantalum (Ta), Tantalum Nitride (TaN), Gold (Au), Silver (Ag), Palladium (Pd) or Chromium (Cr). The protective layer allows carbon diffusion therethrough for the growth of graphene/CNTs while still protecting the catalyst from poisoning, and also offers improved adhesion of the grown material (graphene/CNTs) to the substrate. The protective layer can also be engineered to be lifted-up with growing CNTs, revealing 3D structures. The protected catalyst scheme can additionally be used in etching processes where the catalyst is required to be protected from etchant attacks through the use of protective layers.

Examples of where the protected catalyst scheme is particularly useful include:
1. situations where a graphene sheet is desired to act as a barrier layer to protect the host materials from acid attack or oxidation. For instance, a reliably attached graphene sheet on metal surfaces is highly desirable in metal overcoats to act as corrosion barrier resistant structures. This can be for thin metal sheets used in applications, such as in vehicles/roofing as well as for bulk structures such as reinforced steels, girders or machinery, etc.,
2. where high quality material is required for structures and/or applications that rely on the high conductivity and mobility of graphene/CNTs such as in high speed transistors, graphene/CNT based interconnects, transparent conducting electrodes, fuel cells, membranes and electrodes, spin devices, MEMs, field emission displays, corrosion free electrodes, programmable in-situ device fabrication, etc. The protected catalyst scheme protects the whole structure from environmental as well as process impurities and allows the growth of the necessary high quality material.
3. Where etching of a film such as a dielectric or metal layer coated over a catalyst is required, while keeping the catalyst protected by etchant attack. The protected catalyst scheme of the invention allows this and is the only route to get high density growth of CNTs or seeding of graphene to challenge the current conduction requirements for future interconnects to replace copper. The previously used approach poses reliability issues due to their poor adhesion to the substrate, low density and parasitic growth of the material from sidewalls.
4. The protected catalyst scheme can be used to fabricate graphene/CNT based 3D structures. This may allow the production of high quality graphene/CNT shells or overcoats on predefined shapes, where the catalyst has a protective layer on which the graphene/CNTs are grown to the required dimensions and shapes.

The prior art teaches that CVD growth of graphene or CNTs involves decomposition of hydrocarbon feedstock at high temperatures (700-1100° C.) on a metal catalyst. [3] Graphene is generally grown directly on Copper (Cu) or Nickel (Ni) or a mixture of the two metals foils which serve both as the catalyst and substrate without any support layer. [2] Other commonly used catalyst materials for graphene growth are Ruthenium (Ru), Cobalt (Co), Iron (Fe), Rubidium (Rd), Platinum (Pt), Iridium (Ir), Palladium (Pd), Rhodium (Rh) and carbides. [4, 5] In case of carbon nanotubes, commonly used catalyst materials are Fe, Ni, and Co. [6] Other materials such as Copper (Cu), Silver (Ag), Gold (Au), Pt and Pd have also been used as catalyst for CNT growth. Commonly used substrates for CNT growth are Silicon (Si), Aluminium Oxide ($Al_2O_3$), Silicon Carbide (SiC), steel, zeolite etc., and commonly used support materials are Silicon Dioxide ($SiO_2$), $Al_2O_3$, Cu, Aluminium (Al), Ta, TaN, TiN etc. [6, 7]

Figure 1:
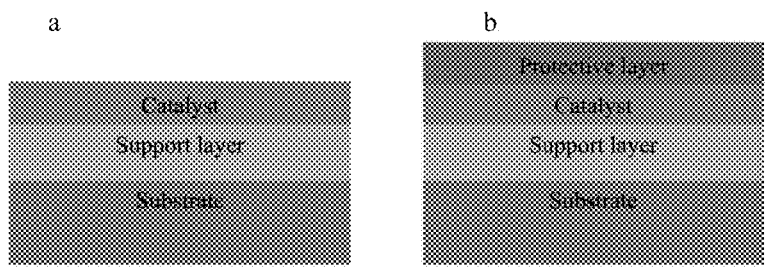
FIG. 1a shows the general scheme adopted in the prior art for the growth of graphene or carbon nanotubes (CNT's) where the catalyst remains susceptible to atmospheric poisoning.
FIG. 1b shows a protected catalyst scheme according to one embodiment of the invention for the growth of graphene or CNTs where the catalyst is protected by an outer capping or protective layer.

FIG. 1(a) illustrates the general composition of layers used in the prior art where catalyst is always at the top (i.e. outside) and therefore directly exposed to the hydrocarbon feedstock during the CVD process of graphene or CNTs. As previously discussed, prior to the growth process, the catalyst layer remains susceptible to environmental poisoning.

Alternatively, FIG. 1(b) shows the general composition of the 'protected catalyst scheme' on the invention, although it will be readily understood that the catalyst and support layer could be combined into one layer. Here a catalyst is capped by a protective layer which protects the catalyst from environmental impurities prior to the growth process as well as process impurities. In the protected catalyst scheme carbon radicals diffuse through the capping layer for the growth of graphene or CNTs. Growth of graphene initiates under the capping/protective layer, whereas CNTs protrude through or lift-up the capping layer. The grown material using the protected catalyst scheme has shown better adhesion to the substrate, suitable for many applications including corrosion resistant metal overcoats and electrically/thermally connected carbon nano-layers to the substrate.

Example 1—Growth of Graphene Using the Protected Catalyst Scheme

Figure 4:
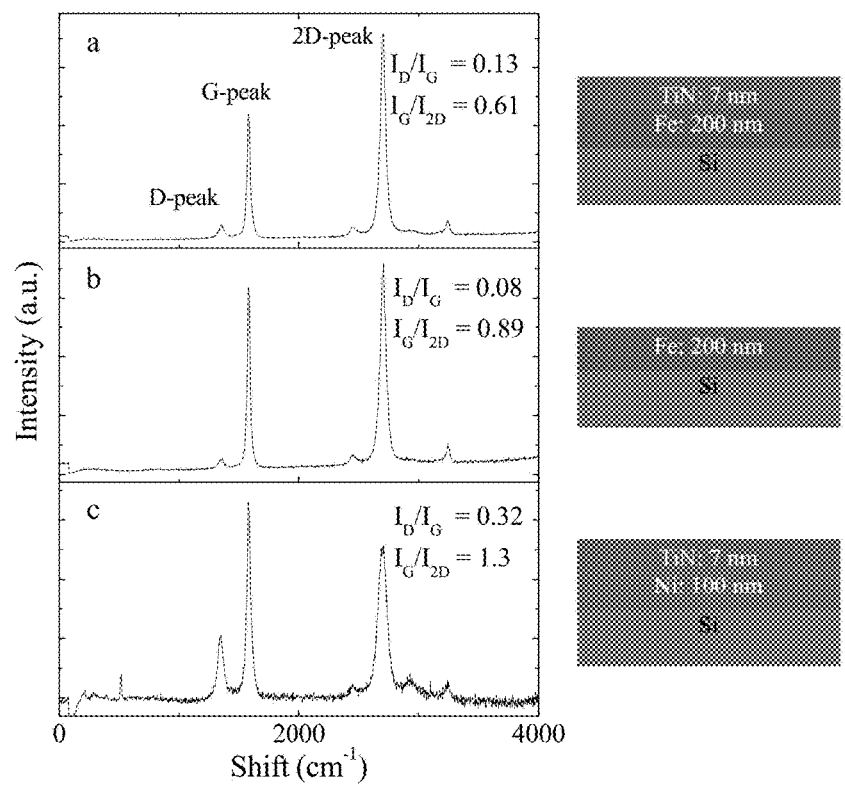

Growth of graphene using the protected catalyst scheme was demonstrated on two different substrates; namely, ordinary steel sheets of 1 mm thickness and Si. For the Si substrates, two catalyst materials, Fe (200 nm) and Ni (100 nm), were chosen, whereas only Fe (200 nm) was used for steel substrates. A 7 nm TiN film was used as the catalyst capping/protective layer for both substrates. For the sake of comparison, growth of graphene was also performed without a catalyst capping/protective layer. Schematics of the respective layer structures are shown in FIG. 2 and FIG. 4. All the materials were sputter deposited onto the substrates using the conditions summarised in Table 1.

TABLE 1

Deposition conditions used for different material in a JLS-Design MPS 500 sputtering kit. Any such sputter, evaporation, electro-deposition or solution processing unit can be used to produce the layer structure for the growth of graphene or CNTs.

| Material | Voltage (V) | Current (A) | Power (W) | Ar (sccm) | $N_2$ (sccm) | Pressure (mTorr) | Rate (nm/min) |
|---|---|---|---|---|---|---|---|
| TiN | 390 | 0.69 | 270 | 25 | 20 | 4 | 3.33 |
| Fe | 300 | 0.20 | 60 | 25 | — | 4 | 3 |
| Ni | 294 | 0.20 | 60 | 25 | — | 4 | 3 |
| Al | 380 | 0.31 | 120 | 25 | — | 4 | 4 |

Graphene growth was carried out in a photo-thermal chemical vapour deposition (PTCVD) system [8-11]. In PTCVD, optical energy is delivered from the top by IR lamps situated in the head of the chamber, while the sample is placed on a water-cooled chuck. In this arrangement, the top surface of a sample reaches temperature around 800° C., whereas the bulk of the sample remains below 470° C. [11] The bulk temperature of a sample is recorded by a pyrometer present at the bottom side of the substrate. The temperature of a sample is mainly controlled by the electrical power supplied to the optical lamps, the gases used and pressure of the gases in the chamber. [8] The thermal conductivity of the gases in the chamber also plays an important role in the thermal energy kinetics. Samples are pre-heated at 460° C. (substrate bulk temperature) in flowing $H_2$ (100 sccm) for 10 min at 2 Torr pressure and growth of graphene is carried out for 5 min using $C_2H_2$ (10 sccm) as the carbon feedstock. Samples are characterized using a Renishaw Systems 2000 Raman Spectroscope using a 514 nm laser excitation source.

The Raman spectra of as-grown graphene on steel substrates and corresponding layer structures is illustrated graphically in FIG. 2, where FIG. 2(a, c) are the spectra of graphene grown using the protected catalyst scheme, and FIG. 2(b, d) are the spectra of graphene grown using generally adopted layout in the prior art.

Well-defined first order and second order Raman features are observed: the D-peaks around 1350 cm$^{-1}$, the G-peak around 1580 cm$^{-1}$ and the 2D-peaks around 2700 cm$^{-1}$. The D-peak is defect induced and its intensity increases with increasing the structural defects in the material or due to the presence of amorphous carbon. [12] The strongest feature in the Raman spectra is the G-peak, which is associated with the Raman-active $E_{2g}$ vibrations of sp$^2$ bonded carbon atoms and hence, its presence is the signature of graphitization in the material. Its intensity increases as the degree of graphitization in the material increases, therefore, the intensity ratio of the G-peak and the D-peak ($I_D/I_G$) is often used as a measure of the quality of a graphite-like material. [13] Thus, the low $I_D/I_G$ values (below 0.26) calculated from the Raman spectra are indicative of high structural quality of as-grown graphene. The quality of graphene is further improved when TiN/Al (15/10 nm) bilayers are used under Fe catalyst, as indicated by the lower $I_D/I_G$ values of 0.11 and 0.05 in FIG. 2(c) and FIG. 2(d), respectively. The 2D-peak is the overtone of D-peak but its intensity is independent of defects, since in this second order Raman process, both scattering events are associated with phonons, in contrary to the D-peak where one out of two scattering events is defect related. [12] The shape and respective height of the 2D-peak with respect to the G-peak ($I_G/I_{2D}$) is associated to the interlayer coupling of electronic band structures and number of layers of graphene sheets, respectively. [14-16] The $I_G/I_{2D}$ values in FIG. 2(a-c) are 0.24-1.2 which corresponds to 1-3 layers of graphene, whereas $I_G/I_{2D}$ value in FIG. 2(d) is 1.6 which correspond to multilayer graphene. [14, 15] The $I_G/I_{2D}$ (0.24) of the sample with the catalyst-capping-layer of TiN (FIG. 2(a)) shows the characteristics of single-layer-graphene (SLG), whereas the $I_G/I_{2D}$ (1.23) of the sample without the catalyst-capping layer (FIG. 2(b)) corresponds to few-layer graphene (FLG). Similarly, the Raman spectrum of the sample given in FIG. 2(c) (with capping-layer) corresponds to few-layer graphene, whereas the spectrum given in FIG. 2(d) (without capping-layer) corresponds to multilayer graphene. This implies that the capping-layer (TiN) can also be utilized to limit or control the number of graphene layers.

The 2D-peak in a Raman spectrum of graphite is broader and has two components, which is explained with the help of interlayer coupling of electronic band structure in graphite. [14] SLG always shows a narrow single Lorentzian 2D-peak because of the absence of other graphene layers. FIGS. 3(a) and (b) show the magnified 2D-peaks of the Raman spectra of FIGS. 2 (a) and (c), respectively. The sharp FWHM (full width half maximum) of 26 cm$^{-1}$ and single Lorentzian shape of the peak in FIG. 3(a) further confirms the growth of single-layer graphene on the steel substrate using the methodology proposed. A narrow FWHM of 48 cm$^{-1}$ and single Lorentzian shape of the 2D-peak in FIG. 3(b) indicates the absence of interlayer coupling of electronic band structures in FLG graphene, which is in agreement with Reina et al. [17] who stated it as a positive effect for maintaining intrinsic SLG properties in each layer of FLG.

The Raman spectra of graphene grown on a Si substrate and the corresponding schematics of layer structures are illustrated in FIG. 4. All spectra show well-defined Raman peaks including the D-peaks around 1345 cm$^{-1}$, the G-peaks around 1580 cm$^{-1}$ and the 2D-peaks around 2700 cm$^{-1}$. FIGS. 4(a) and (c) are the Raman spectra of as-grown graphene using the protected catalyst scheme, where two catalyst materials, Fe (FIG. 4(a)) and Ni (FIG. 4(c)), are used to show the versatility of the 'protected catalyst scheme'. FIG. 4(b) shows the Raman spectrum of the as-grown graphene using the general scheme with an Fe catalyst. Relatively high quality of as-grown material using Fe catalyst is achieved when compared with that of using Ni catalyst, as indicated by the lower $I_D/I_G$ values in FIG. 4(a, b). The values of $I_G/I_{2D}$ and shape of the 2D-peaks reveal that growth of FLG occurred in FIG. 4(a, b), whereas growth of multi-layered-graphene is expected in FIG. 4(c).

Example 2—Growth of CNTs Using the Protected Catalyst Scheme

The layer structure used for CNT growth using the protected catalyst scheme is shown in FIG. 5. A 50 nm layer of TiN film is sputter deposited on n-Si substrate, followed by the deposition of a 10 nm Al film. Over the TiN/Al bilayer, a layer of Fe (as a catalyst) is deposited and capped by a TiN film.

Three thicknesses of Fe films: 3 nm, 6 nm and 9 nm are deposited on various samples and for each of the Fe thickness, three thicknesses of TiN films: 3.5 nm, 7 nm and 17 nm are deposited in order to demonstrate the versatility of the protected catalyst scheme. All the films on a sample are deposited sequentially in an inert gas environment without breaking vacuum. This was performed using the MS-Design MPS 500 sputter kit, which allowed the sequential deposition of up to four metal targets in a single run without breaking vacuum. Hence, the catalyst exposure to the atmosphere is avoided in this way.

The growth of carbon nanotubes was carried out in the PTCVD system at 2 Torr $H_2$ (100 sccm)/$C_2H_2$ (10 sccm) pressure, in the substrate bulk temperature range of 375° C.-440° C. Heat treatment of the samples was performed first in the $H_2$ environment and then growth of CNTs was carried out for 5 minutes using 10 sccm of $C_2H_2$.

SEM images of the CNTs grown at a substrate bulk temperature of 400° C., using the protected catalyst scheme for the samples containing 3 nm and 6 nm Fe protected by 3.5 nm and 7 nm TiN films, are shown in FIG. 6. Vertically aligned CNTs with areal density of ~$10^9$ $cm^{-2}$ can be observed in all the images. The growth rate of CNTs grown on 3 nm Fe protected by 3.5 nm TiN film is 2 μm/min, whereas for the remaining three samples in the images the growth rate is around 1 μm/min. The achieved growth rate is higher when compared with other reports on CNT growth at low temperatures on metallic layers. [18-20] The demonstration of CNT growth in the protected-catalyst scheme is of paramount importance because of the potential benefits associated with this including the prevention of the catalyst from oxidation.

FIG. 7 shows the SEM micrographs of the CNTs grown as a function of temperature on 3 nm Fe protected by 3.5-17 nm thick TiN films. FIGS. 6 and 7 show vertically aligned and dense CNT growth for all the samples in the temperature range of 375-400° C. However, the vertical alignment and density of CNTs was observed to have degraded for higher temperatures (420-440° C.), which may be because of the partial poisoning of the catalyst nanoparticles. The effect is particularly prominent on the samples containing thicker films of TiN; sparse CNTs can be observed corresponding to 17 nm TiN.

The experiment was repeated, increasing the thickness of the Fe catalyst to 6 nm and 9 nm while keeping the remaining parameters identical.

The SEM images for the samples containing 6 nm Fe are shown in FIG. 8 and the images of 9 nm Fe are shown in FIG. 9. The growth of CNTs for the thicker Fe films (6 nm and 9 nm) shows a nearly inverted effect with respect to temperature as compared with FIG. 7, that is, poor or no growth at lower temperature (375° C.) and improved growth for higher temperatures (420-440° C.). Nearly vertically aligned and relatively dense CNTs can be observed for thicker TiN capping layer (7 nm and 17 nm) at higher temperatures, in contrast with FIG. 7. This implies that the degradation of the CNT growth profile because of the partial poisoning of the catalyst can be improved by increasing the thickness of the Fe catalyst film.

CNTs grown using 3 nm Fe are relatively clean but as the thickness of the Fe is increased, the contaminations of CNTs with catalyst particles is also increased. Interestingly, contamination of the CNTs is only because of the thicker Fe films and not because of the TiN film, since the contamination level can be observed similar corresponding to the various thicknesses of TiN in FIG. 7, where 3 nm of Fe catalyst is used. This implies that TiN film remains at the bottom of the sample which may result in improved attachment of the CNTs with the substrate.

FIG. 10 contains the Raman spectra of the CNTs grown on 3 nm Fe protected by the TiN film of 3.5 nm, 7 nm and 17 nm in the temperature range of 375-420° C. The SEM analysis and the presence of well-defined G-peaks along with the 2D-peaks in the Raman spectra confirm the synthesis of CNTs. The $I_D/I_G$ ratio of 0.73 achieved in the protected catalyst scheme at substrate bulk temperature of 400° C. for 3.5 nm TiN capping layer is comparable to the CNTs grown at 700° C. under standard hotwall or thermal CVD growth conditions. [21, 22]

Figure 11:
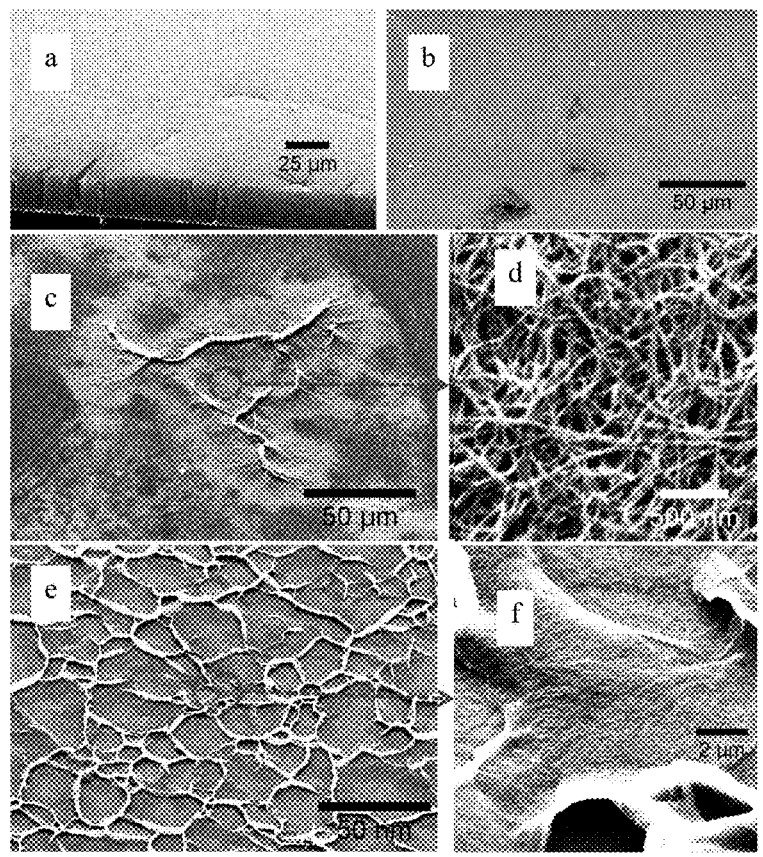

Example 3—Measuring Adhesion Improvement of the CNTs Using the Protected Catalyst Scheme In order to estimate the adhesion improvement of the CNTs grown using the protected catalyst scheme, a comparative test based on the sonication of the samples was performed. CNTs grown on a substrate using the general approach (without protecting catalyst) can be removed easily upon subjecting the sample to an ultrasonic bath, due to their poor attachment with substrate. For comparison, a sample where CNTs are grown using the general approach (without topmost capping layer of TiN in FIG. 5) was prepared and the resulting CNTs are shown in FIG. 11(*a*).

For the sonication bath test, two CNT grown samples at 400° C. (shown in FIG. 6) on 3 nm Fe were selected: Fe protected by 3.5 nm TiN and by 7 nm TiN. All three samples (two of protected catalyst scheme and one of general approach) were dipped into separate vials of methanol and sonication was performed for one minute using 100% power of the sonicator (Ultrawave's Qi-100 ultrasonic cleaner). The SEM images of the samples after the sonication bath are presented in FIG. 11(*b-f*). All CNTs are removed from the sample where CNTs were grown using the general approach (FIG. 11(*b*)), partial removal of the CNTs are observed for the sample containing 3.5 nm TiN capping layer (FIG. 11(*c, d*)) and no removal of CNTs is observed for the sample containing 7 nm TiN capping layer (FIG. 11(*e, f*)). Thus, enhanced CNT-substrate attachment is achieved using the protected catalyst scheme. This is also applicable in the case of graphene growth, as explained below. The adhesion of CNTs on substrate is increased by increasing the thickness of the capping layer of TiN, which provides an open field to tune the CNT-substrate attachment according to the requirements. A general phenomenon of CNT densification in a solvent can also be observed which destroys the vertical alignment of the CNTs. [23]

Figure 12:
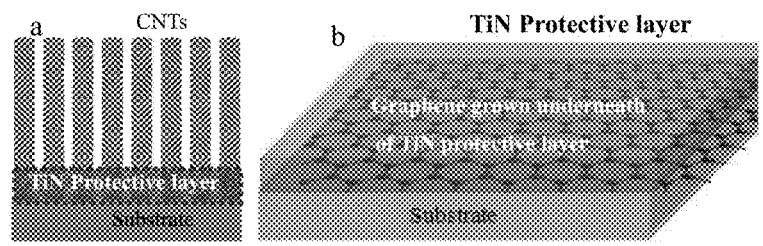

As stated earlier that the whole material of the protective coating film consisting of TiN (capping layer) remains at the bottom of the sample (i.e. is not lifted up with the growing CNTs) and growth of CNTs starts below the layer of TiN, since the catalyst is underneath of the TiN capping layer. In this scenario, each CNT would have been enveloped by the capping layer of TiN at its root, as illustrated in FIG. 12(*a*), which may be the mechanism of strong attachment of CNTs with substrate. This also explains why enhanced attachment of CNTs with substrate is observed for the sample containing thicker (7 nm) capping layer of TiN; thicker films envelops larger surface area of CNTs. The same concept of adhesion improvement can be extended to the growth of graphene using the protected catalyst scheme, that is, the graphene growth should occur on the catalyst underneath the capping layer (TiN) which would improve its adhesion. This is illustrated in FIG. 12(b).

Figure 13:
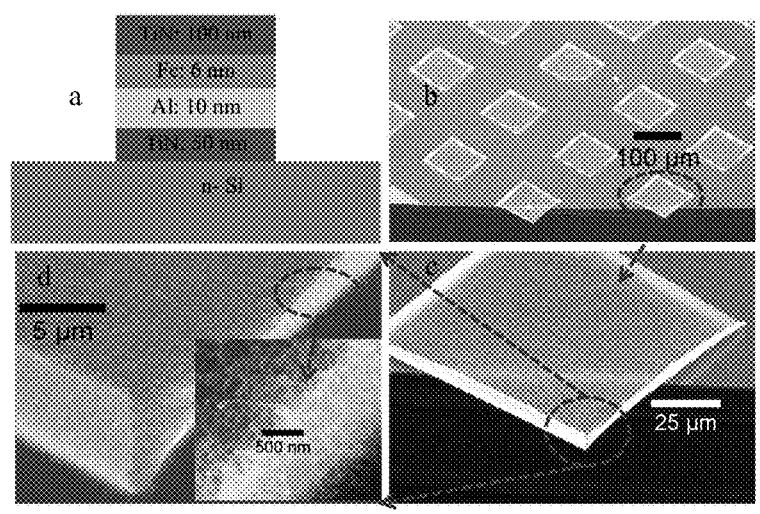

It is noted that the CNTs can be grown with further increase in the thickness of TiN capping layer which may further enhance the attachment of CNTs. As an example of this the growth of CNTs on 6 nm Fe capped with 100 nm TiN layer at 440° C. is presented. The schematic of the layer structure is shown in FIG. 13(a), where 6 nm Fe capped with 100 nm TiN is sputter deposited over TiN/Al (50/10 nm) layers and the whole structure is patterned to 100×100 μm$^2$ squares, using a lift-off process. The CNT growth on this sample is carried out at 440° C. (substrate bulk temperature) at 2 Torr pressure of $H_2/C_2H_2$ (100/10 sccm) using the PTCVD system. The as-grown CNTs are shown in FIG. 13(b-c). It can be observed in the cross-sectional SEM image of the sample given in FIG. 13(b, c) that the CNT grown square-pads remained un-cut during the cleavage of the sample with a diamond scribe which indicates their high strength. The strength of the pads may be because of the formation of CNT-TiN composite while CNTs were growing through the TiN capping layer. Demonstration of such robust CNT based structures is highly important and can be employed in various applications such as CNT based electronic devices, integrated circuit interconnects, corrosion-free electrodes, high strength composites, super capacitor electrodes, electrodes for solar cells, fuel cell electrodes, etc.

Example 4—Fabrication of CNT Based Vias

One of the key benefits of using CNTs in vias (vertical interconnects) and other electronic devices is their high aspect ratio and the ability to grow from the bottom. The filling of high aspect ratio vias using a conventional top-down metal filling scheme has been stated amongst the foremost challenges of interconnect technology. [24] The high aspect ratio of CNTs and bottom-up growth approach can be exploited to engineer high aspect ratio vias with high connection (between top and bottom metal layers) certainty. However, the deposition of the catalyst for the CNT growth at the bottom of a high aspect ratio via is challenging.

Generally, the catalyst deposition in high aspect ratio vias is carried out using the conventional top-down deposition scheme which not only results in the side-wall deposition but also some quantity of catalyst reaching the bottom being reduced. [18] The sidewall deposition of the catalyst results in the parasitic growth of CNTs originating from the dielectric material, such as $SiO_2$, which cannot take part in electrical conduction, and also hinders the growth of CNTs growing from the bottom, [18] as depicted in FIG. 14(a). Therefore, a suitable technique is required which enable the CNT growth originating only from the bottom surface of a via, as illustrated in FIG. 14(b). One approach (known as the buried catalyst approach) is to deposit the catalyst film before the deposition of $SiO_2$ and patterning. However, protecting the thin catalyst layer by precisely stopping the etching at the catalyst film in the subsequent patterning of $SiO_2$ is challenging. The protected-catalyst scheme not only provides a CMOS compatible solution to all of the above mentioned problems, but also can be a breakthrough for many potential application areas of carbon nanotubes and graphene.

A schematic of the process flow for the fabrication of CNT-based via structures using the protected catalyst scheme and general scheme is shown in FIG. 15. A layer stack (M1) of Ti (30 nm), Cu (150 nm), TiN (50 nm) and Al (10 nm) is deposited as bottom metal lines on n-Si substrate. In the case of protected catalyst scheme, a 3 nm Fe catalyst is deposited over M1 followed by the deposition of a 7 nm TiN film as the protective layer of the catalyst (step 2). All these layers are deposited sequentially in a single run without breaking the vacuum. A 300 nm of $SiO_2$ film is sputter deposited and patterned lithographically to define vias on M1 (step 3). Due to the protective layer of TiN the catalyst remained protected during the reactive ion etching of the $SiO_2$ layer which is performed for 10 minutes using $CF_4$ (30 sccm) and Ar (10 sccm) at 60 mTorr pressure and 100 watt RF power. In the general scheme, a 300 nm $SiO_2$ film is deposited over M1, patterned lithographically and etched down to M1 (step 2). After this a 3 nm Fe catalyst is sputter deposited and photoresist then removed (step 3).

The CNT growth is carried out in a PTCVD system using a mixture of $H_2/C_2H_2$ (100/10 sccm) at 2 Torr pressure, while the substrate bulk temperature is kept at 400° C. Catalyst heat-treatment is performed for 10 minutes at 2 Torr pressure in a $H_2$ environment prior to the growth of CNTs. By introducing 10 sccm $C_2H_2$, the growth of CNTs is carried out for 5 minutes (step 4). A 300 nm Al film is sputter deposited, patterned and etched as a top metal contact (not shown). Finally, electrical measurements of the CNT-based vias are performed.

The SEM image of CNTs grown in the vias using protected catalyst scheme are shown in FIG. 16(a). Since, CNT growth occurs only from the catalyst site, all CNTs are originating from the bottom metal strips (M1), ensuring a reliable electrical contact. The CNTs are vertically aligned and dense (~$10^9$ cm$^{-2}$), suitable for interconnect via application. The applications of patterned growth using protected catalyst scheme is not limited to the CNT-based interconnects; instead it can be used in programmable in-situ patterned growth of graphene and CNTs for various 3D structures as well as for combined graphene and CNT based horizontal and vertical interconnects. FIG. 16(b) shows the current-voltage characteristics of 100 CNT-based vias of 10×10 μm$^2$ dimensions fabricated through protected catalyst scheme and through general scheme. Linear ohmic behaviour can be observed in both cases with a significant improvement in the conductivity of CNT-based vias fabricated through protected catalyst scheme. The improvement in the conductivity is attributed to the protection of the catalyst from environmental poisoning such as oxidation and increased number of CNTs available for conduction because of the inhibition of parasitic CNT growth from the sidewalls.

Additionally, the protected catalyst scheme can be used for the combined growth of graphene and CNTs to act as horizontal and vertical interconnects respectively, as depicted in FIG. 16(c).

Example 5—Using Different Materials for the Capping Layer

The previous examples were conducted using TiN film as a catalyst capping layer. However, as previously discussed TiN is not the only material that can act as a catalyst capping layer. Any material which allows the diffusion of carbon down to the catalyst can be used in the protected catalyst scheme to act as a catalyst capping layer. Here we demonstrate the thin films of Ti, TaN, Cr, Au, Ag and Pd as a catalyst capping layer. Only growth of CNTs is demonstrated, however, it will be readily understood that this is also applicable for the graphene growth.

FIG. 17 shows a schematic of the layer structure used in this example where different materials are used as the catalyst capping layer. A 50 nm of TiN film is sputter deposited on n-Si substrate followed by the deposition of 10 nm Al and 3 nm Fe (catalyst), respectively. A film of 5±1 nm of Ti, TaN, Cr, Au, Ag and Pd are sputter deposited separately on different samples to act as the catalyst protective layer. CNT growth is carried out at 420° C. (substrate bulk temperature) in a PTCVD system, using a mixture of $H_2/C_2H_2$ (100/10 sccm) at 2 Torr pressure. Catalyst heat-treatment is performed for 10 minutes in $H_2$ environment prior to the growth of CNTs. $C_2H_2$ (10 sccm) is used as carbon source gas for the growth of CNTs and growth is carried out for 5 minutes.

SEM images of the CNTs grown on n-Si substrate using protected catalyst scheme where thin films (5±1) of various materials are used to act as a catalyst capping layer are shown in FIG. 18. Vertically aligned growth of CNTs is achieved on the samples where a capping layer of Ti and Cr is used, whereas tangled CNT growth is observed for rest of the capping layer materials. Sparse growth of CNTs and formation of Au particles is observed for Au-based catalyst capping layer, whereas CNT bumps can be observed for Pd-based capping layer which may have resulted from the wrapping up of Pd around growing CNTs. Different CNT growth profiles corresponding to the various catalyst-capping layer materials provide further versatility of the protected catalyst scheme which can be tailored according to various application requirements.

Raman spectra (514 nm laser wavelength) of CNTs grown on Si substrate using protected catalyst scheme where a film of 5±1 nm of Ti, Cr, Au, Ag, Pd and TaN is used as a catalyst capping layer are shown in FIG. 19. Well-defined Raman peaks can be seen in the spectra including the D-peaks around 1345 $cm^{-1}$, the G-peak around 1580 $cm^{-1}$ and the 2D-peaks around 2700 $cm^{-1}$. Presence of well-developed G-peaks around 1580 $cm^{-1}$ indicate that the as-deposited material (CNTs) is graphitized for all capping layer materials. However, $I_D/I_G$ values indicate that the quality of the CNTs depend on the material of the capping layer. The samples with Pd and Au based-capping layers result in relatively poor quality ($I_D/I_G$=1.1-1.5) of the CNTs whereas the samples with Ti, Ag and Cr based capping layers produced average quality ($I_D/I_G$=0.68-0.75) of the CNTs. The sample containing TaN-based capping layer resulted in the high quality ($I_D/I_G$=0.49) growth of CNTs.

Example 6-3D Structures

It has been demonstrated that the material and thickness of the protective layer can be selected and optimised to give various configurations to the graphene and/or CNTs to be grown. For instance, when a TiN based protective layer is used, the as-grown CNTs protrude through the TiN layer and increased adhesion of the CNTs with the substrate is observed. This is discussed in Example 3, above, and shown in FIGS. 11 and 13. However, when Pd is used as the protective layer, CNT bumps wrapped with Pd are achieved as can be observed in FIG. 18. The material and thickness of the protective layer can therefore be selected to create materials with functionalities suitable for a variety of applications.

Here, we demonstrate the use of the protected catalyst scheme in revealing 3D structures which can be used for in-situ 3D programmable patterning.

A layer stack of TiN/Al/Fe (50/10/3 (nm)) were sputter deposited on n-Si substrate followed by the spin coating of around 3 μm thick polyimide (PI-5878) film as schematically shown in FIG. 20(a). The thickness of the polyimide film was reduced to 500 nm using oxygen plasma etching. CNT growth was carried out in a PTCVD system using $C_2H_2/H_2$ (10/100 sccm) at 2 Torr pressure and 400° C. substrate bulk temperature. Heat treatment of the sample was performed in a $H_2$ environment for 10 minutes followed by the CNT growth for 5 minutes.

The polyimide film was lifted-up with the growth of CNTs as schematically shown in FIG. 20(b) and can be observed in the SEM image shown in FIG. 20(c), showing the cross-section of the sample (45° tilted) where the polyimide film can be seen at the top of the as-grown CNTs. Other polymers and plastic materials can also be used as a protective layer.

A 3D structure is formed when the polyimide film lifts-up due to the growth of the CNTs. Accordingly, the protective layer has separated from the attachment surface due to the growth of the CNTs.

In use at least two different materials could form the protective layer of a layer stack. In one embodiment the protective layer could comprise TiN/polyimide sublayers, where prior to CNT growth the TiN sublayer is situated adjacent to the attachment surface and the polyimide sublayer is situated adjacent to the TiN sublayer. When CNTs were grown this would cause the polyimide sublayer to lift-up and separate from the TiN sublayer, which would remain adjacent to the attachment surface. Advantageously, the TiN sublayer would improve adhesion of the CNTs, and the polyimide sublayer would form a 3D structure.

In an alternative embodiment, TiN could provide the protective layer on a predefined part of the surface of the layer stack for the growth of graphene or CNTs and polyimide film could provide the protective layer over the remainder of the surface of the layer stack for the growth of CNTs. This would result in the pre-defined portions of the protective layer, which comprised polyimide, being lifted-up when CNTs were grown, while the remaining portion of the protective layer would remain adjacent to the attachment surface. This would result in a 3D structure being formed when CNTs were grown.

Alternatively, this approach could be combined with the catalyst protective-etching, as demonstrated in example 4. This could also allow sites to be selectively defined such that only graphene will grow and alternative sites can be defined such that only CNTs will grow. As the protective layer is lifted-up at the sites where the CNTs grow, but not at the sites where graphene grows, a 3D structure will be formed.

This approach can be used in CMOS (complementary metal oxide semiconductors) technology or other electronic device processing. Additionally, it will make the processes more efficient.

By carefully designing structures where portions of the structure may include 3D patterning, as described above, and specific portions may be designed to grow CNTs while other portions are designed to grow graphene this technology could be used in integrated circuits and/or printed circuit boards devices and interconnects.

Example 7—Graphene/CNT Growth Using Thermal CVD

The growth of graphene/CNTs using the protected catalyst scheme is not limited to a PTCVD system, instead any type of CVD can be used. As an example, here we demonstrate growth of CNTs using the protected catalyst scheme in a thermal CVD system. In this system, the stage (where the sample is mounted) is heated using a resistive heating system which transfers the necessary thermal energy to the catalyst for the growth of carbon nano-materials. CNT growth is carried out on various samples at 700° C. for 10 minutes using a mixture of $C_2H_2/H_2$ (25/200 sccm) at 10 Torr chamber pressure. Samples were pre-heated for 10 minutes in $H_2$ environment prior to the CNT growth. In this case the whole structure, including the substrate is heated to the temperature necessary to nucleate the carbon nanostructure.

The layer structure is same as shown in schematic of FIG. 17 where different materials are used as the catalyst protective layer. A 50 nm of TiN film is sputter deposited on n-Si substrate followed by the deposition of 10 nm Al and 3 nm Fe (catalyst), respectively. A film of 5±1 nm of Ti, Ta, Cr, Au, Ag and Pd are sputter deposited separately on different samples to act as the catalyst protective layer.

SEM images of the CNTs grown using protected catalyst scheme in the thermal CVD system are shown in FIG. 21. It can be observed that different protective layers resulted in different profile of the as-grown CNTs. Ti based protective layer resulted in CNT bumps, Ta resulted in sparse CNTs, Cr resulted in dense and tangled CNTs, Au resulted in CNT ropes, Ag resulted in short CNT bumps and Pd resulted in tangled CNTs. This implies that different materials and process conditions can be selected and optimised to choose between different CNT growth profiles according to the application requirements.

Raman spectra (514 nm laser wavelength) of the CNTs grown using the protected catalyst scheme in a thermal CVD system are shown in FIG. 22. Well-defined Raman peaks can be seen in the spectra including the D-peaks around 1345 $cm^{-1}$ and the G-peak around 1580 $cm^{-1}$. Where the protective layers are Ti, Ta and Cr based, the 2D-peaks can also be observed around 2700 $cm^{-1}$. Presence of well-developed G-peaks around 1580 $cm^{-1}$ indicate that the as-deposited material (CNTs) is graphitized for all protective layer materials. However, the varying $I_D/I_G$ values indicate that the quality of the CNTs depend on the material of the protective layer.

Example 8—Growth of CNTs or Graphene in Cavities Provided in the Layer Stack

FIG. 23a is a schematic of a layer stack provided with a cavity. The layer stack of FIG. 23a comprises a substrate, a support layer disposed adjacent the substrate, a catalyst layer disposed adjacent the support layer, an additional layer disposed adjacent the support layer, wherein the additional layer and catalyst layer define an indentation, and a protective layer disposed adjacent the additional layer and over the indentation to form a cavity. In this embodiment, the attachment surface for the CNT or graphene growth is disposed within the cavity, adjacent the catalyst layer.

If the layer stack of FIG. 23a is used to grow CNTs from the attachment surface the length of the CNTs can be controlled such that CNTs extend from the attachment surface to the protective layer, but do not extend any further, as depicted in FIG. 23b. The cavity may be under vacuum or filled with a gas. Preferably the cavity will be filled with an inert gas.

FIG. 24a is a schematic of an alternative embodiment of the layer stack, comprising two protective layers. The layer stack of FIG. 24a comprises a substrate, a support layer disposed adjacent the substrate, a catalyst layer disposed adjacent the support layer, a first protective layer disposed adjacent the catalyst layer, an additional layer disposed adjacent the first protective layer, wherein the additional layer and first protective layer define an indentation, and a second protective layer disposed adjacent the additional layer and over the indentation to form a cavity. In this embodiment, the attachment surface for the CNT or graphene growth is preferably disposed adjacent the catalyst layer.

As with the previous embodiment, if the layer stack of FIG. 24a is used to grow CNTs from the attachment surface the length of the CNTs can be controlled such that CNTs extend from the attachment surface to the protective layer, but do not extend any further, as depicted in FIG. 24b. The cavity may be under vacuum or filled with a gas. Preferably the cavity will be filled with an inert gas.

FIG. 25a is a schematic of a further alternative embodiment of the layer stack where the catalyst layer is provided on the opposite side of the cavity to the substrate. The layer stack of FIG. 25a comprises a substrate, an additional layer disposed adjacent the substrate, wherein the additional layer and the substrate define an indentation, a catalyst layer disposed adjacent the additional layer and over the indentation to form a cavity, and a protective layer disposed adjacent the catalyst layer. In this embodiment, the attachment surface for the CNT or graphene growth is preferably disposed within the cavity, adjacent the catalyst layer.

If the layer stack of FIG. 25a is used to grow CNTs from the attachment surface the length of the CNTs can be controlled such that CNTs extend from the attachment surface to the substrate layer, but do not extend any further, as depicted in FIG. 25b. The cavity may be under vacuum or filled with a gas. Preferably the cavity will be filled with an inert gas.

FIG. 26a is a schematic of a final further alternative embodiment of the layer stack where the layer stack comprises two attachment surfaces provided on opposite sides of the cavity. The layer stack of FIG. 26a comprises a substrate, a support layer disposed adjacent to the substrate, a first catalyst layer disposed adjacent the support layer, an additional layer disposed adjacent the first catalyst layer, wherein the additional layer and first catalyst layer define an indentation, a second catalyst layer disposed adjacent the additional layer and over the indentation to form a cavity, and a protective layer disposed adjacent the second catalyst layer. In this embodiment, the first attachment surface for the CNT or graphene growth is preferably disposed within the cavity, adjacent the first catalyst layer, and the second attachment surface for the CNT or graphene growth is preferably disposed with the cavity, adjacent the second catalyst layer.

If the layer stack of FIG. 26a is used to grow CNTs from the attachment surfaces the length of the CNTs can be controlled such that CNTs extend from one attachment surface to the opposite attachment surface, but do not extend any further. FIG. 26b shows a schematic where CNTs have started to grow from the two attachment surfaces but have not yet grown to reach the opposite attachment surface. This approach could result in higher density of CNTs in the cavity. The cavity may be under vacuum or filled with a gas. Preferably the cavity will be filled with an inert gas.

While not shown in the Figures, it will be readily understood that additional protective layers can be provided adjacent to each of the attachment surfaces.

Figure 23:
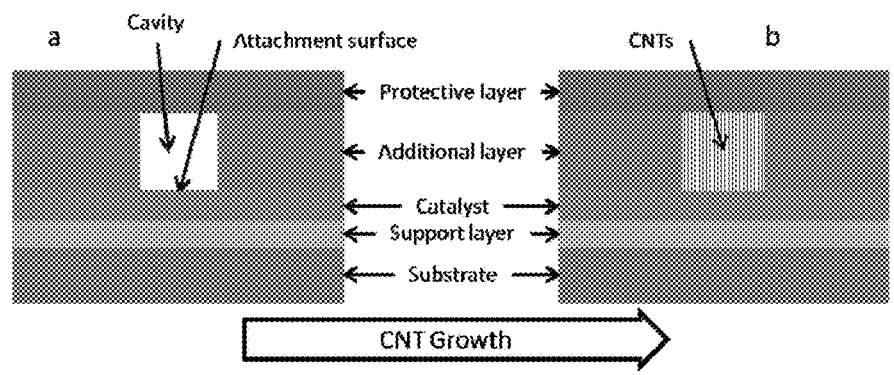
Figure 24:
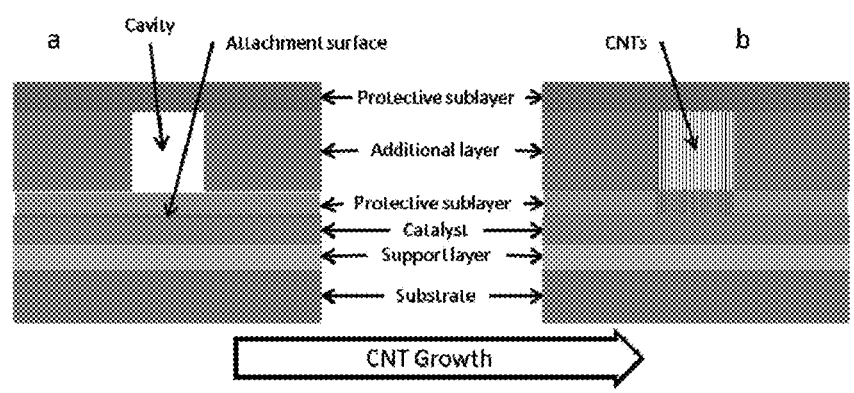
Figure 26:
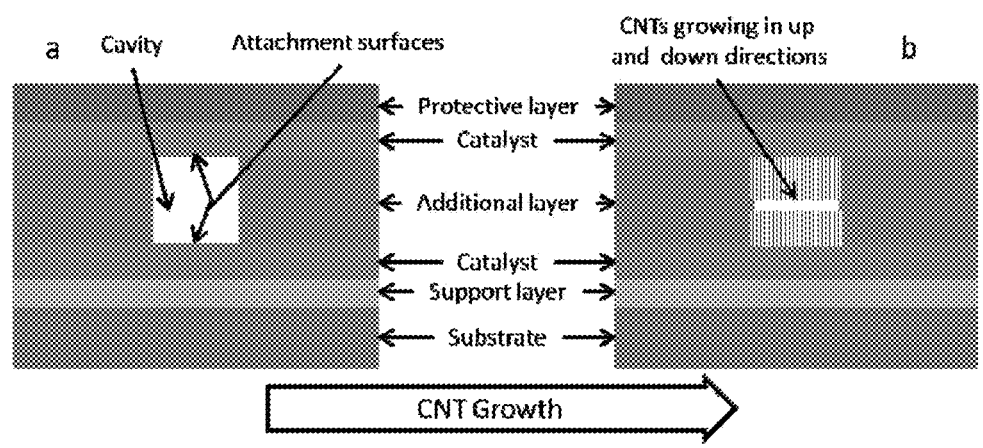

While shown in FIGS. 23, 24 and 26, it will be readily understood by the skilled person, in light of the previous description, that the support layer is optional. A similar layer stack could be provided without a support layer. Additionally, it will be readily understood that the catalyst layer shown in FIGS. 23 and 24 and the first catalyst layer shown in FIG. 26 are not necessary in embodiments where the substrate is itself capable of catalysing the growth of the CNTs.

For the above embodiments the protective layer may comprise TiN, preferably with a cross-section of around 7 nm, and/or polyimide, preferably with a cross-section of around 500 nm. The catalyst layer may comprise Fe, preferably with a cross-section of around 3 nm. The support layer may comprise two sublayers comprising TiN and Al, preferably with a cross-section of around 50 nm and 10 nm respectively. The additional layer may comprise $SiO_2$, preferably with a cross-section of around 500 nm.

CNTs or graphene can be grown, using the methods previously discussed, such that the or each protective layer allows carbon diffusion therethrough to the or each attachment surface. Accordingly, CNTs or graphene will grow from the or each attachment surface.

SUMMARY

The 'protected catalyst' scheme for the growth of graphene and CNTs is demonstrated where a catalyst capping layer such as Ti, TiN, Ta, TaN, Cr, Au, Ag and Pd is used to protect the catalyst. The capping layer not only protects the catalyst from the environmental poisoning but also allows the diffusion of carbonaceous feedstock through it for the growth of graphene or carbon nanotubes. Raman spectra analysis indicates the growth of single, few and multiple layers of high quality graphene on steel and Si substrates, using the protected catalyst scheme. Vertically aligned and dense (~$10^9$ cm$^{-2}$) growth of CNTs is also achieved using protected catalyst scheme. The scheme proposed can be implemented in traditional thermal CVD growth of carbon materials or other systems that allow for the coupling of energy to the catalyst along with a suitable carbon feedstock. The carbon feedstock could be in gas, liquid or solid form within the substrate structure proposed. Substrates could be pre-treated to incorporate the carbon source. A comparative adhesion test shows that the CNTs grown by the protected catalyst scheme are more strongly attached with the substrate surface and the strength of the attachment increases with increasing the thickness of the capping layer of TiN. The protected catalyst scheme is successfully used in revealing the fabrication of CNT based vias where the catalyst remained protected from etchant attack during the reactive ion etching of $SiO_2$. The protected catalyst scheme can also be used for revealing 3D structures, patterns and simultaneous graphene-CNT growth. The protected catalyst scheme that has been developed is a breakthrough in many potential application areas of graphene and carbon nanotubes as it protects the catalyst from oxidation prior to the growth, maintains the high quality and high conductivity of the grown material, allows the etching of $SiO_2$ (or other dielectric materials) in a buried catalyst scheme while keeping the catalyst protected from etchants and improve the adhesion of graphene/CNTs on the host material.

REFERENCES

1. Wang, H.-X., et al., *Graphene in Light: Design, Synthesis and Applications of Photo-active Graphene and Graphene-Like Materials*. Small, 2013. 9(8): p. 1266-1283.
2. Zhang, Y., L. Zhang, and C. Zhou, *Review of Chemical Vapor Deposition of Graphene and Related Applications*. Accounts of Chemical Research, 2013. 46(10): p. 2329-2339.
3. Robertson, J., et al., *Synthesis of carbon nanotubes and graphene for VLSI interconnects*. Microelectronic Engineering, 2013. 107(0): p. 210-218.
4. Batzill, M., *The surface science of graphene: Metal interfaces, CVD synthesis, nanoribbons, chemical modifications, and defects*. Surface Science Reports, 2012. 67(3-4): p. 83-115.
5. An, H., W.-J. Lee, and J. Jung, *Graphene synthesis on Fe foil using thermal CVD*. Current Applied Physics, 2011. 11(4, Supplement): p. S81-S85.
6. Seah, C.-M., S.-P. Chai, and A. R. Mohamed, *Synthesis of aligned carbon nanotubes*. Carbon, 2011. 49(14): p. 4613-4635.
7. Kumar, M. and Y. Ando, *Chemical Vapor Deposition of Carbon Nanotubes: A Review on Growth Mechanism and Mass Production*. Journal of Nanoscience and Nanotechnology, 2010. 10(6): p. 3739-3758.
8. Chen, G. Y., et al., *Growth of carbon nanotubes at temperatures compatible with integrated circuit technologies*. Carbon, 2011. 49(1): p. 280-285.
9. Tan, Y. Y., et al., *Photo-thermal chemical vapor deposition growth of graphene*. Carbon, 2012. 50(2): p. 668-673.
10. Shang, N. G., et al., *High-rate low-temperature growth of vertically aligned carbon nanotubes*. Nanotechnology, 2010. 21(50): p. 6.
11. Ahmad, M., et al., *Efficient coupling of optical energy for rapid catalyzed nanomaterial growth: high-quality carbon nanotube synthesis at low substrate temperatures*. ACS applied materials & interfaces, 2013. 5(9): p. 3861-6.
12. Saito, R., et al., *Double resonance Raman spectroscopy of single-wall carbon nanotubes*. New Journal of Physics, 2003. 5: p. 1-157.
13. Tuinstra, F. and J. L. Koenig, *Raman Spectrum of Graphite*. Journal of Chemical Physics, 1970. 53(3): p. 1126-1131.
14. Ferrari, A. C. and D. M. Basko, *Raman spectroscopy as a versatile tool for studying the properties of graphene*. Nature Nanotechnology, 2013. 8(4): p. 235-246.
15. Reina, A., et al., *Large Area, Few-Layer Graphene Films on Arbitrary Substrates by Chemical Vapor Deposition*. Nano Letters, 2009. 9(1): p. 30-35.
16. Li, X., et al., *Large Area Synthesis of High-Quality and Uniform Graphene Films on Copper Foils*. Science, 2009. 324(5932): p. 1312-1314.
17. Reina, A., et al., *Large Area, Few-Layer Graphene Films on Arbitrary Substrates by Chemical Vapor Deposition*. Nano Letters, 2008. 9(1): p. 30-35.
18. van der Veen, M. H., et al., *Electrical characterization of CNT contacts with Cu Damascene top contact*. Microelectronic Engineering, 2013. 106: p. 106-111.
19. Nihei, M., et al., *Electrical properties of carbon nanotube bundles for future via interconnects*. Japanese Journal of Applied Physics Part 1-Regular Papers Short Notes & Review Papers, 2005. 44(4A): p. 1626-1628.
20. Nessim, G. D., et al., *Low Temperature Synthesis of Vertically Aligned Carbon Nanotubes with Electrical Contact to Metallic Substrates Enabled by Thermal Decomposition of the Carbon Feedstock*. Nano Letters, 2009. 9(10): p. 3398-3405.
21. Lee, Y. T., et al., *Temperature-dependent growth of carbon nanotubes by pyrolysis of ferrocene and acetylene* in the range between 700 and 1000 degrees C. Chemical Physics Letters, 2003. 372(5-6): p. 853-859.
22. Shamsudin, M. S., et al., *Effect of Synthesis Temperature on the Growth Iron Filled Carbon Nanotubes as Evidenced by Structural, Micro-Raman, and Thermogravimetric Analyses.* Advances in Condensed Matter Physics, 2012.
23. Wang, T., et al., *Formation of three-dimensional carbon nanotube structures by controllable vapor densification.* Materials Letters, 2012. 78(0): p. 184-187.
24. ITRS, *International Technology Roadmap for Semiconductors, edition: Interconnect: Tables, Chapter.* 2011.

The invention claimed is:

1. A layer stack for growing graphene or carbon nanotubes (CNTs), wherein the layer stack comprises a substrate, a protective layer and an attachment surface disposed therebetween, wherein the protective layer comprises a material selected from the group consisting of titanium nitride (TiN), titanium (Ti), tantalum (Ta), tantalum nitride (TaN), gold (Au), silver (Ag), palladium (Pd), chromium (Cr), boron nitride (BN), molybdenum disulfide (MoS2), molybdenum selenide (MoSe), and tungsten sulphide (WS2), and allows carbon diffusion therethrough to the attachment surface such that graphene or CNTs grow therefrom, and wherein either (i) the substrate is capable of catalysing the growth of graphene and/or CNTs from the attachment surface, or (ii) the layer stack further comprises a catalyst layer disposed between the substrate and the protective layer and the catalyst layer is capable of catalysing the growth of graphene and/or CNTs from the attachment surface.

2. A layer stack according to claim 1, wherein the attachment surface for the graphene or CNTs is disposed between the substrate and protective layers and adjacent to the protective layer.

3. A layer stack according to claim 1, wherein the substrate comprises nickel (Ni), copper (Cu), iron (Fe) or steel.

4. A layer stack according to claim 1, wherein the catalyst layer comprises a material selected from a group consisting of: Copper (Cu), Nickel (Ni), Ruthenium (Ru), Cobalt (Co), Iron (Fe), Rubidium (Rd), Platinum (Pt), Iridium (Ir), Palladium (Pd), Rhodium (Rh), carbides, Silver (Ag), Gold (Au), steel or a composite of any two or more of the aforementioned materials.

5. A layer stack according to claim 4, wherein the catalyst layer is between 1 nm and 500 nm in cross-section.

6. A layer stack according to claim 4, wherein the layer stack further comprises a support layer disposed between the catalyst layer and the substrate.

7. A layer stack according to claim 6, wherein support layer is between 2 nm and 400 nm in cross-section.

8. A layer stack according to claim 1, wherein the protective layer is between 1 nm and 500 nm in cross-section, or between 1 nm and 100 nm in cross-section, or between 3.5 nm and 17 nm in cross-section.

9. A layer stack according to claim 1, wherein the substrate comprises a material selected from a group consisting of: Silicon (Si), Aluminium Oxide (Al2O3), Silicon Carbide (SiC), steel, Copper (Cu), Nickel (Ni), plastics, polymers, glass, Gallium Arsenide (GaAs), Aluminium (Al) and zeolite or the substrate comprises a material coated with a 2D layered material.

10. A method for manufacturing a layer stack for use in growing graphene or carbon nanotubes (CNTs), the method comprising:—
a) providing a substrate capable of catalysing the growth of graphene and/or CNTs, and
b) depositing a protective layer on the substrate, such that an attachment surface is disposed between the substrate and the protective layer, thereby creating a layer stack, wherein the protective layer comprises a material selected from the group consisting of titanium nitride (TiN), titanium (Ti), tantalum (Ta), tantalum nitride (TaN), gold (Au), silver (Ag), palladium (Pd), chromium (Cr), boron nitride (BN), molybdenum disulfide (MoS2), molybdenum selenide (MoSe), and tungsten sulphide (WS2), and allows carbon diffusion therethrough to the attachment surface, such that graphene or CNTs grow therefrom.

11. A method according to claim 10, wherein the catalyst layer and/or protective layer are sputter deposited, cluster source deposited, electron beam evaporated, thermally evaporated, solution deposited, solution evaporated, ion implanted, spin coated, chemical vapour deposited, plasma chemical vapour deposited, plasma immersion deposited or electrodeposited.

12. A layer stack for growing graphene or carbon nanotubes (CNTs), wherein the layer stack comprises a substrate, a protective layer, a cavity provided within the layer stack, and an attachment surface, wherein the protective layer comprises a material selected from the group consisting of titanium nitride (TiN), titanium (Ti), tantalum (Ta), tantalum nitride (TaN), gold (Au), silver (Ag), palladium (Pd), chromium (Cr), boron nitride (BN), molybdenum disulfide (MoS2), molybdenum selenide (MoSe), and tungsten sulphide (WS2), and allows carbon diffusion therethrough to both the cavity and the attachment surface, such that graphene or CNTs grow from the attachment surface, and wherein the substrate is capable of catalysing the growth of graphene or CNTs from the attachment surface or wherein the layer stack further comprises a catalyst layer disposed between the substrate and the protective layer.

13. A layer stack according to claim 12, wherein the layer stack comprises an additional layer disposed between the substrate and the protective layer, wherein the additional layer defines an indentation and the protective layer is disposed over the indentation to form the cavity.

14. A layer stack according to claim 13, wherein the catalyst layer is disposed on the opposite side of the cavity to the protective layer, wherein the catalyst layer is capable of catalysing the growth of the CNTs or graphene from the attachment surface.

15. A layer stack according to claim 14, wherein the layer stack further comprises a support layer disposed between the catalyst layer and the substrate and/or wherein the layer stack comprises two protective layers, wherein the first protective layer is disposed between the catalyst layer and the additional layer, and the second protective layer is disposed over the indentation, defined by the additional layer, to form the cavity.

16. A layer stack according to claim 12, wherein the catalyst layer is disposed between the protective layer and the cavity wherein the catalyst layer is capable of catalysing the growth of the CNTs or graphene from the attachment surface.

17. A layer stack according to claim 12, wherein the layer stack comprises two attachment surfaces.

18. A layer stack according to claim 17, wherein the two attachment surfaces are provided on opposite sides of the cavity and the first attachment surface is adjacent to a first catalyst layer and the second attachment surface is adjacent to a second catalyst layer.

19. A method for manufacturing a layer stack for use in growing graphene or carbon nanotubes (CNTs), the method comprising:—
- a) providing a substrate and depositing a catalyst layer capable of catalysing the growth of the graphene and/or the CNTs thereon; and
- b) depositing a protective layer on the catalyst layer, such that an attachment surface is disposed between the catalyst layer and the protective layer and the catalyst layer is disposed between the substrate and the protective layer, thereby creating a layer stack, wherein the protective layer comprises a material selected from a group consisting of: Titanium Nitride (TiN), Titanium (Ti), Tantalum (Ta), Tantalum Nitride (TaN), Gold (Au), Silver (Ag), Palladium (Pd), Chromium (Cr), boron nitride (BN), molybdenum disulfide ($MoS_2$), molybdenum selenide (MoSe), and tungsten sulphide ($WS_2$) and allows carbon diffusion therethrough to the attachment surface such that graphene or CNTs grow therefrom.

* * * * *